(12) United States Patent
Mishima et al.

(10) Patent No.: US 9,609,251 B2
(45) Date of Patent: Mar. 28, 2017

(54) MANUFACTURING METHOD OF SEMICONDUCTOR DEVICE

(71) Applicant: CANON KABUSHIKI KAISHA, Tokyo (JP)

(72) Inventors: Ryuichi Mishima, Machida (JP); Hideaki Ishino, Fujisawa (JP); Kenji Togo, Kawasaki (JP); Masatsugu Itahashi, Yokohama (JP); Takehito Okabe, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/790,989

(22) Filed: Jul. 2, 2015

(65) Prior Publication Data
US 2015/0304587 A1 Oct. 22, 2015

Related U.S. Application Data

(63) Continuation of application No. 13/645,147, filed on Oct. 4, 2012, now Pat. No. 9,082,639.

(30) Foreign Application Priority Data

Oct. 7, 2011 (JP) ................................ 2011-223290

(51) Int. Cl.
| | |
|---|---|
| *H01L 31/062* | (2012.01) |
| *H04N 5/3745* | (2011.01) |
| *H01L 27/088* | (2006.01) |
| *H01L 27/146* | (2006.01) |
| *H01L 31/0224* | (2006.01) |
| *H01L 21/8234* | (2006.01) |
| *H01L 27/06* | (2006.01) |

(52) U.S. Cl.
CPC ......... *H04N 5/3745* (2013.01); *H01L 27/088* (2013.01); *H01L 27/1463* (2013.01); *H01L 27/14612* (2013.01); *H01L 27/14625* (2013.01); *H01L 27/14632* (2013.01); *H01L 27/14685* (2013.01); *H01L 27/14687* (2013.01); *H01L 31/022408* (2013.01); *H01L 21/823418* (2013.01); *H01L 21/823462* (2013.01); *H01L 27/0617* (2013.01); *H01L 27/1464* (2013.01)

(58) Field of Classification Search
CPC ............... H01L 27/10894; H01L 31/14; H01L 27/14643
USPC .................................................. 257/290–293
See application file for complete search history.

(56) References Cited

U.S. PATENT DOCUMENTS

| | | | |
|---|---|---|---|
| 2001/0030699 A1* | 10/2001 | Sakuragi | ........... H01L 27/14609 348/302 |
| 2004/0036789 A1* | 2/2004 | Shinohara | ......... H01L 27/14603 348/308 |
| 2008/0203311 A1* | 8/2008 | Watanabe | ............. G01T 1/2928 250/370.08 |
| 2009/0290058 A1* | 11/2009 | Miyagawa | ........ H01L 27/14609 348/308 |
| 2010/0203670 A1* | 8/2010 | Ohtani | ............. H01L 21/76895 438/98 |

(Continued)

*Primary Examiner* — Julia Slutsker
(74) *Attorney, Agent, or Firm* — Canon U.S.A. Inc., IP Division

(57) ABSTRACT

A drain of a first transistor is formed by performing ion implantation on a semiconductor substrate using a first member as a mask for a gate electrode of the first transistor. Further, ion implantation is performed on the gate electrode of the second transistor after thinning a second member.

20 Claims, 11 Drawing Sheets

(56) References Cited

U.S. PATENT DOCUMENTS

2012/0115270 A1* 5/2012 Arakawa ............ H01L 27/14609
438/75

* cited by examiner

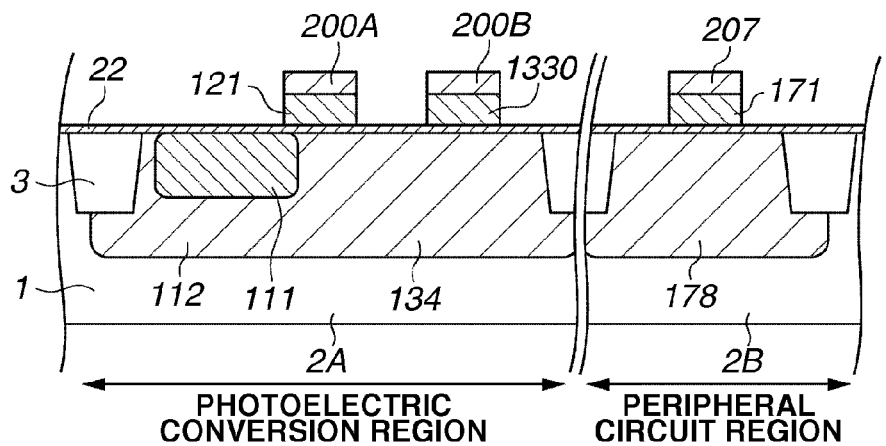
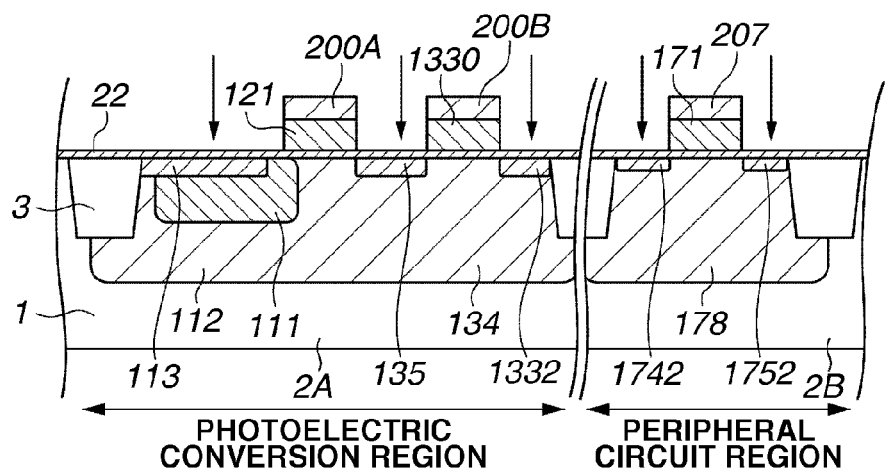
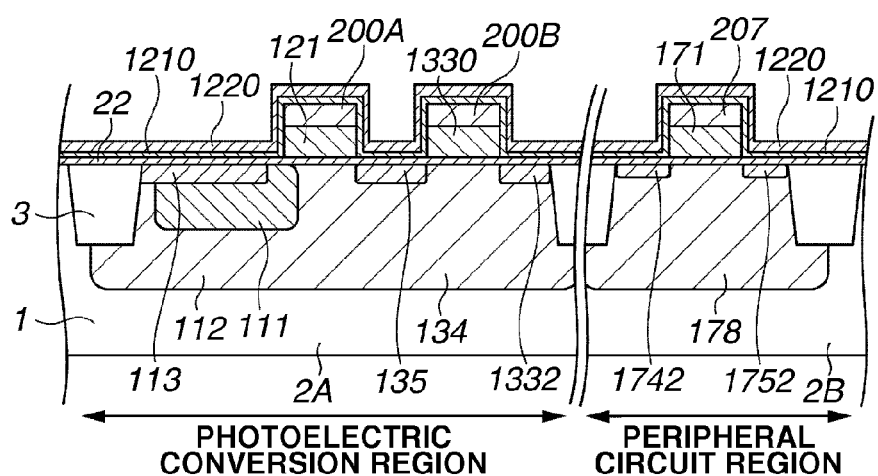

MANUFACTURING METHOD OF SEMICONDUCTOR DEVICE

CROSS REFERENCE TO RELATED APPLICATIONS

This application is a Continuation of U.S. patent application Ser. No. 13/645,147 filed Oct. 4, 2012, which claims priority to Japanese Patent Application No. 2011-223290 filed Oct. 7, 2011, each of which are hereby incorporated by reference herein in their entireties.

BACKGROUND OF THE INVENTION

Field of the Invention

The present invention relates to a manufacturing method of a semiconductor device including transistors having characteristics different from one another.

Description of the Related Art

There is a semiconductor device such as a photoelectric conversion device which includes transistors having different characteristics from one another. US2008/0029793 discusses a photoelectric conversion device in which the impurity concentration in the drain of a first transistor arranged in a photoelectric conversion region is lower than the impurity concentration in the drain of a second transistor arranged in a peripheral circuit region.

According to one aspect the impurity concentration in a gate electrode for the transistor is controlled to stably operate. However, there is no sufficient discussion in US2008/0029793 on controlling the impurity concentration in the gate electrodes of the first transistor and the second transistor.

SUMMARY OF THE INVENTION

Aspects of the present invention are directed to a manufacturing method of a semiconductor device capable of appropriately controlling the impurity concentration in the gate electrode of each of the first transistor and the second transistor.

According to an aspect of the present invention, a manufacturing method of a semiconductor device including a first transistor and a second transistor in which a gate insulation film is thinner than a gate insulation film of the first transistor, includes forming a first member and a second member on a polysilicon film covering a semiconductor substrate, forming, by performing patterning on the polysilicon film using the first member as a mask, a gate electrode of the first transistor from a portion of the polysilicon film including impurity, and, by performing patterning on the polysilicon film using the second member as a mask, a gate electrode of the second transistor from a portion of the polysilicon film including impurity, forming, by performing ion implantation on the semiconductor substrate using the first member as a mask with respect to the gate electrode of the first transistor, a drain of the first transistor, and forming, by implanting ions in the semiconductor substrate, a drain of the second transistor wherein ion implantation on the gate electrode of the second transistor after thinning the second member, is performed in parallel with forming the drain of the second transistor.

According to the exemplary embodiment of the present invention, the manufacturing method can appropriately control the impurity concentration in the gate electrode in each of the first transistor and the second transistor.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIGS. 5A, 5B, 5C, 5D, 5E, 5F, 5G, 5H, 5I, 5J, 5K, and 5L, are cross-sectional views illustrating steps A, B, C, D, E, F, G, H, I, J, K, and L respectively in an example of a manufacturing method of the photoelectric conversion device according to the first exemplary embodiment.

DESCRIPTION OF THE EMBODIMENTS

Figure 1A:
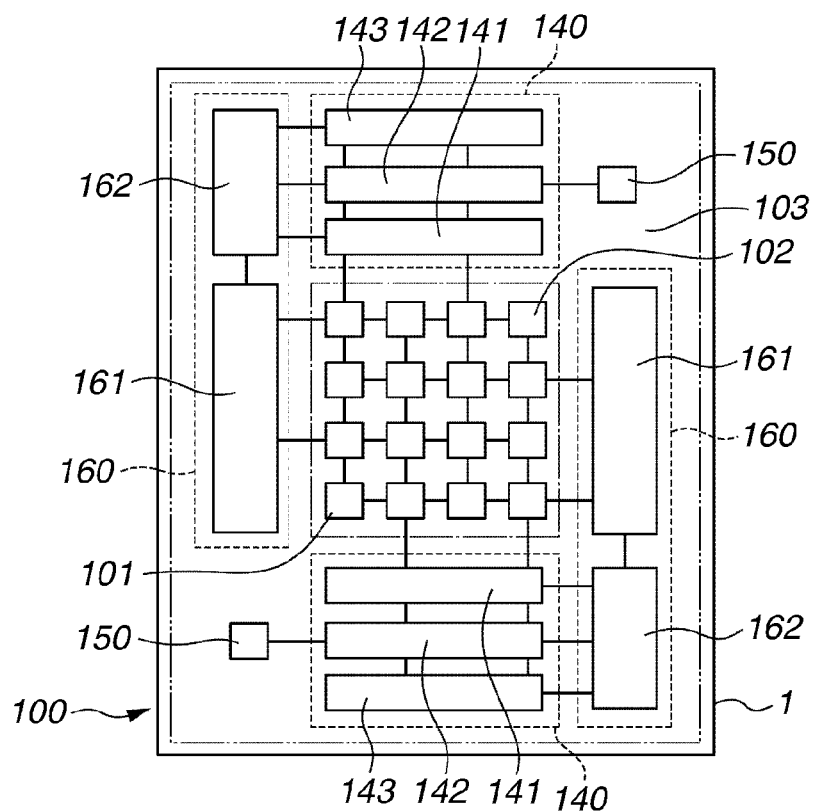
FIG. 1A is a schematic plane view illustrating an example of the photoelectric conversion device.

Various exemplary embodiments, features, and aspects of the invention will be described in detail below with reference to the drawings.

An example of the photoelectric conversion device, i.e., a semiconductor device, will be described below with reference to FIG. 1. Common components in FIGS. 1A, 1B, and thereafter will be assigned the same reference numerals, and description thereof will be omitted.

Referring to FIG. 1A, a photoelectric conversion device 100 includes a photoelectric conversion region 101 surrounded by a dashed-dotted line. A plurality of photoelectric conversion units 102 is arranged in the photoelectric conversion region 101. FIG. 1A illustrates an example in which the plurality of photoelectric conversion units 102 is arranged horizontally and vertically to form an area sensor. However, the plurality of photoelectric conversion units 102 may be linearly arranged to form a linear sensor.

Figure 1B:
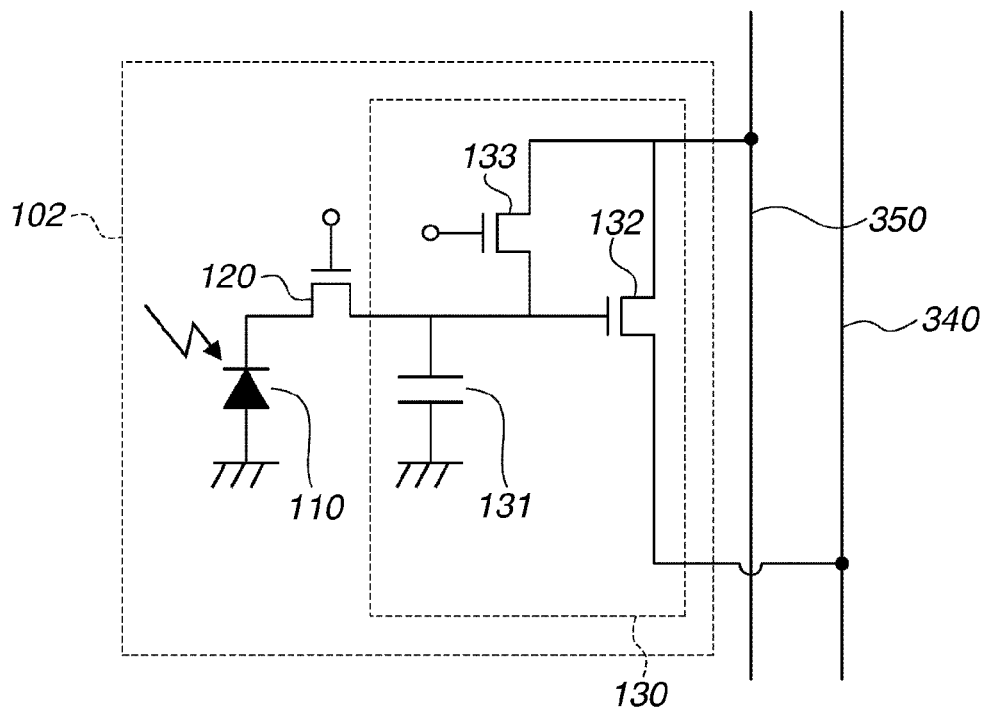
FIG. 1B is a schematic view illustrating an example of an equivalent circuit of a photoelectric conversion unit.

Referring to FIG. 1B, the photoelectric conversion unit 102 includes a photoelectric conversion element 110, a signal generation unit 130, and a transfer gate 120. The signal generation unit 130 generates an electric signal based on a signal charge generated in the photoelectric conversion element 110. The transfer gate 120 then transfers the signal charge from the photoelectric conversion element 110 to the signal generation unit 130. According to the present exemplary embodiment, the signal generation unit 130 includes a capacitor 131, an amplifying transistor 132 having a gate connected to the capacitor 131, and a reset transistor 133 having a source connected to the capacitor 131.

When light enters the photoelectric conversion element 110, a signal charge is generated in the photoelectric conversion element 110. When the transfer gate 120 is switched on, the signal charge generated in the photoelectric conversion element 110 is transferred via a transfer channel to the capacitor 131 in the signal generation unit 130. As a result, the signal charge is stored in the capacitor 131.

A gate voltage corresponding to an amount of the signal charge stored in the capacitor 131 is applied to the gate of the amplifying transistor 132. The amplifying transistor 132 is a source follower circuit, and the electric signal generated according to the gate voltage of the amplifying transistor 132 is output via a signal output line 340.

When the reset transistor 133 is switched on, the gate voltage of the amplifying transistor 132 connected to the capacitor 131 is reset to a voltage determined according to a potential supplied via a drive line 350. The signal generation unit 130 may further include a selection transistor which switches on and off an output to the signal output line 340.

According to the present exemplary embodiment, one photoelectric conversion element 110 and one signal generation unit 130 forma pair in the photoelectric conversion unit 102. However, at least one portion of the signal generation unit 130 (e.g., the amplifying transistor 132) may be shared by a plurality of the photoelectric elements 110. In such a case, the transfer gate 120 may be formed for each of the plurality of the photoelectric conversion elements 110.

Further, the transfer gate 120 may have a charge storing structure for temporarily storing a signal charge to realize a global shutter. The photoelectric conversion element 110 and the amplifying transistor 132 may be directly connected without having the transfer gate 120 in between. Japanese Patent Application Laid-Open No. 2000-312024 discusses the structure in which the photoelectric conversion element 110 and the amplifying transistor 132 are directly connected.

Figure 2:
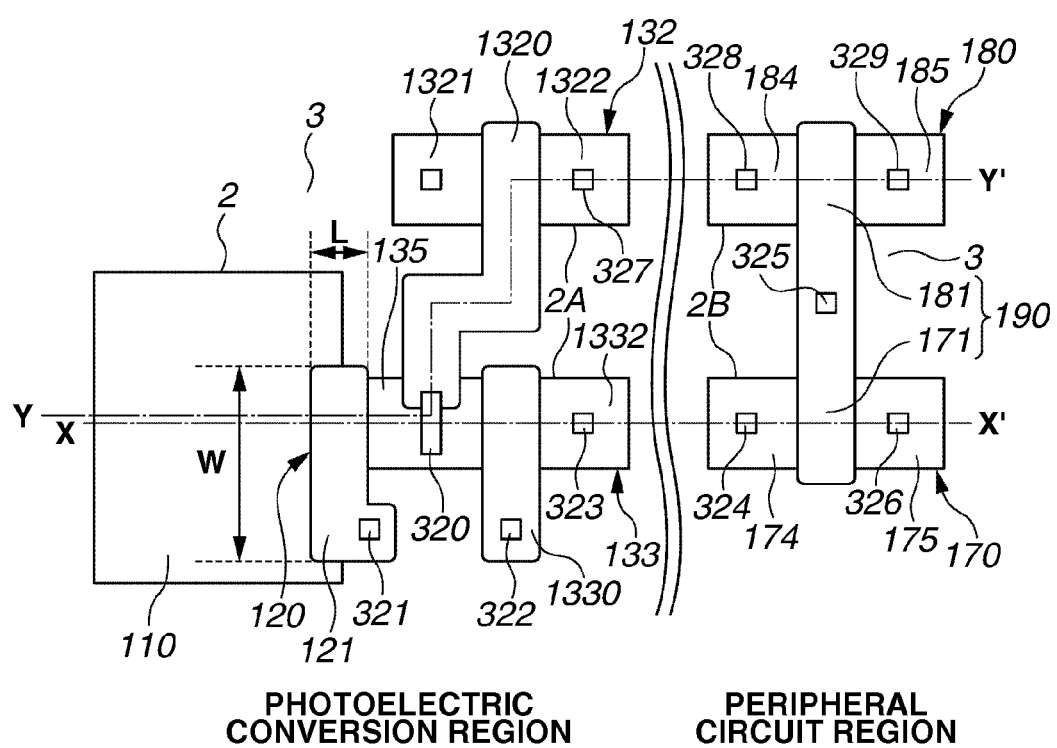
FIG. 2 is a schematic plane view illustrating a layout of the photoelectric conversion unit.
Figure 3A:
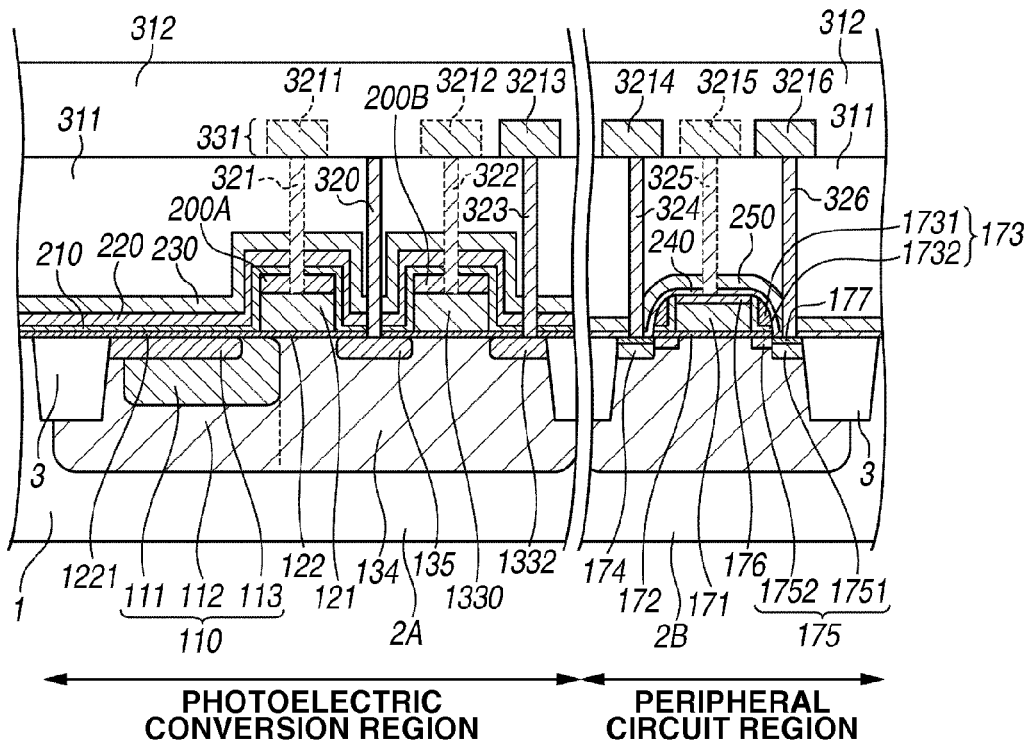
FIGS. 3A and 3B are cross-sectional views illustrating examples of a main portion of the photoelectric conversion device.
Figure 3B:
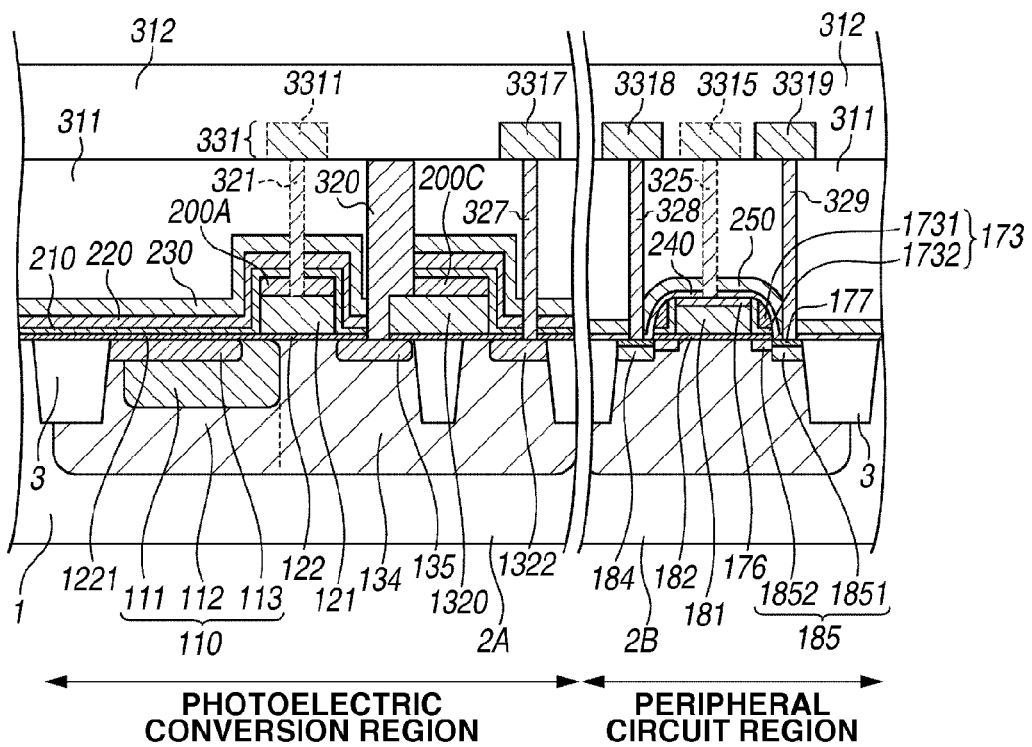

FIG. 2 is a schematic plane view illustrating an example of a layout of the photoelectric conversion unit. FIG. 3A is a cross-sectional view illustrating the layout of the photoelectric conversion unit taken along a line X-X' illustrated in FIG. 2. FIG. 3B is a cross-sectional view illustrating the layout of the photoelectric conversion unit taken along a line Y-Y' illustrated in FIG. 2.

Referring to FIGS. 2, 3A, and 3B, the photoelectric conversion element 110 is arranged in a first active portion 2A in a semiconductor substrate 1 formed of a semiconductor such as single crystal silicon. The portion other than the first active portion 2A is an isolation region 3, and the first active portion 2A is surrounded by the isolation region 3. According to the present exemplary embodiment, the isolation unit 3 has a shallow trench isolation (STI) structure. However, the isolation unit 3 may have a local oxidation silicon (LOCOS) structure or a diffusion isolation structure.

According to the present exemplary embodiment, the photoelectric conversion element 110, and the transfer gate 120, and a fifth semiconductor region 135 and the reset transistor 133 are arranged on the same active region 2, and the amplifying transistor 132 is arranged on a different active region 2. However, the reset transistor 133 and the photoelectric conversion element 110 may be arranged on different active regions 2, and the amplifying transistor 132 and the reset transistor 133 may be arranged on the same first active portion 2A.

Hereinafter, a first conductive type semiconductor region is an impurity region in which an electric charge of the same polarity as the signal charge is a majority carrier. Further, a second conductive type semiconductor region whose conductive type is the opposite of the first conductive type is the impurity region in which the electric charge of the same polarity as the signal charge is a minority carrier.

For example, if the signal charge is an electron, the first conductive type semiconductor region is an n-type semiconductor region, and the second conductive type semiconductor region is a p-type semiconductor region. If the signal charge is an acceptor, the first conductive type semiconductor region is the p-type semiconductor region, and the second conductive type semiconductor region is the n-type semiconductor region.

Each transistor is a field effect transistor (FET) including a source and a drain, and the gate controls conduction between the source and the drain. The gate includes an electrode, a gate insulation film, and a channel region which is the semiconductor region located below the gate insulation film. The gate thus has a metal-insulator-semiconductor (MIS) type structure. A transistor including first conductive type source and drain is defined as a first conductive type transistor, and a transistor including second conductive type source and drain is defined as a second conductive type transistor.

For example, if the signal charge is the electron, the first conductive type transistor is the n-type transistor. If the signal charge is the acceptor, the first conductive type transistor is the p-type transistor.

According to the present exemplary embodiment, the photoelectric conversion element 110 is an embedded type photodiode including a first conductive type semiconductor region 111, a second conductive type semiconductor region 112, and a third conductive type semiconductor region 113. However, the third semiconductor region 113 may be omitted. Further, the photoelectric conversion element 110 may be a photogate.

The first semiconductor region 111 and the second semiconductor region 112 in the photoelectric conversion element 110 function as a charge generation region in which the signal charge is generated. The first semiconductor region 111 and the second semiconductor region 112 form a p-n junction, and the first semiconductor region 111 also functions as an accumulation region which accumulates the signal charge.

The third semiconductor region 113 is located between a surface of the semiconductor substrate 1 and the first semiconductor region 111. The first semiconductor region 111 and the third semiconductor region 113 form the p-n junction, and the third semiconductor region 113 functions as a surface protection region which prevents generation of noise.

The fifth semiconductor region 135 of the first conductive type forms the p-n junction with a fourth semiconductor region 134 of the second conductive type, and functions as a floating diffusion region. The fifth semiconductor region 135 forms a portion of the capacitor 131. The fifth semiconductor region 135 i.e., the floating diffusion region, thus forms a portion of the signal generation unit 130.

The gate electrode of the transfer gate 120 is referred to as a transfer gate electrode 121. A gate insulation film 122 is arranged between the transfer gate electrode 121 and a transfer channel region of the semiconductor substrate 1. The transfer gate electrode 121 is formed of polysilicon.

Examples of the gate insulation film 122 is a monolayer film formed of a silicon oxide layer, a monolayer film formed of a silicon oxynitride layer, and a multilayer film formed of the silicon oxide layer, and the silicon oxynitride layer. According to the present exemplary embodiment, the gate insulation film 122 is the multilayer film in which the silicon oxide layer and the silicon oxynitride layer are arranged in such an order from the semiconductor substrate 1. The gate insulation film 122 may be formed of a high-k material such as hafnium oxide.

The gate of the amplifying transistor 132 includes an amplifying gate electrode 1320 formed of polysilicon and the gate insulation film 122. The amplifying transistor 132 is a first conductive type transistor including a first conductive type source 1321 and a first conductive type drain 1322.

The gate of the reset transistor 133 includes a reset gate electrode 1330 formed of polysilicon and the gate insulation film 122. The reset transistor 133 is a first conductive type transistor including the first conductive type source 135 and a first conductive type drain 1332.

The reset transistor 133 performs a reset operation, i.e., a main operation thereof, along with discharging of the signal charge from the fifth semiconductor region 135. The fifth semiconductor region 135 is thus regarded as the source of the reset transistor 133 for convenience. However, the source and the drain of the reset transistor 133 may temporarily be reversed while driving the photoelectric conversion device 100.

The photoelectric conversion element 110 and the transfer gate 120 are covered by a first intermediate film 210, a first protective film 220 arranged above the first intermediate film 210, and a second protective film 230 arranged above the first protective film 220. The first intermediate film 210, the first protective film 220, and the second protective film 230 each extend to the signal generation unit 130, and cover the amplifying transistor 132 and the reset transistor 133.

According to one aspect, the first intermediate film 210 to be formed of silicon oxide, for the first protective film 220 to be formed of silicon oxynitride, and for the second protective film 230 to be formed of silicon oxide. However, it is not limited thereto.

Referring to FIG. 3A, a first member 200A is arranged between the first intermediate layer 210 and the top surface of the transfer gate electrode 121. Further, a first member 200B is arranged between the first intermediate layer 210 and the top surface of the reset gate electrode 1330.

Referring to FIG. 3B, a first member 220C is arranged between the first intermediate layer 210 and the top surface of the amplifying gate electrode 1320. The first members 200A, 200B, and 200C are members isolated from one another and formed of inorganic insulating material. Silicon compounds such as silicon nitride, silicon oxynitride, silicon oxide, and silicon carbide can be used as the inorganic insulating material. In particular, silicon oxide can be appropriately used. However, it is not limited thereto.

At least one of the first intermediate film 210 and the first protective film 220, the second protective film 230, and the first member 200A, the first member 200B, and the first member 200C may be deleted. However, if at least the first member 200A is formed of silicon oxide, it may be the case that the first member 200A formed of silicon oxide is arranged above the transfer gate electrode 121 to control the light around the transfer gate 120.

The first member 200A contacts only the top surface among the surfaces of the transfer gate electrode 121. The first member 200B contacts only the top surface among the surfaces of the reset gate electrode 1330, and the first member 200C contacts only the top surface among the surfaces of the amplifying gate electrode 1320.

As illustrated in FIGS. 3A and 3B, the photoelectric conversion region is covered by a first interlayer insulating layer 311. The first interlayer insulating layer 311 can be formed of silicon oxide, boron phosphorus silicate glass (BPSG), phosphorus silicate glass (PSG), or boron silicate glass (BSG). As illustrated in FIG. 2, the amplifying gate electrode 1320 extends towards the fifth semiconductor region 135 (i.e., the floating diffusion region). Further, the fifth semiconductor region 135 (i.e., the floating diffusion region) and the amplifying gate electrode 1320 are both connected by a shared contact plug 320.

The fifth semiconductor region 135 and the gate electrode 1320 of the amplifying transistor 132 may be connected using a contact plug and a wiring layer instead of the shared contact plug 320. The transfer gate electrode 121 is connected to the first contact plug 321.

The first contact plug 321 and a second contact plug 322 which are not located on the line X-X' in FIG. 2 are illustrated using dotted lines in FIG. 3A for reference. The first contact plug 321 may be arranged on the first active portion 2A such as on the channel region.

However, according to one aspect the transfer gate electrode 121 may be extended from above the first active portion 2A to above the isolation region 3, and arrange the first contact plug 321 above the isolation region 3 as illustrated in FIG. 3A.

Similarly, the second contact plug 322 is connected to the gate electrode 1330 of the reset transistor 133. The second contact plug 322 may also be arranged above the isolation region 3. A third contact plug 323 is connected to the drain 1332 of the rest transistor 133.

As illustrated in FIG. 3B, an eighth contact plug 328 is connected to the drain 1322 of the amplifying transistor, and a contact plug (not illustrated) is connected to the source 1321 of the amplifying transistor. The first contact plug 321 and the second contact plug 322 which are respectively connected to the transfer gate electrode 121 and the reset gate electrode 1330, penetrate through the first members 200A and 200B.

As illustrated in FIG. 3A, a first wiring layer 331 including a first wiring 3311, a second wiring 3312, and a third wiring 3313, is arranged above the first interlayer insulating layer 311. The first wiring 3311, the second wiring 3312, and the third wiring 3313 are respectively connected to the first contact plug 321, the second contact plug 322, and the third contact plug 323.

As illustrated in FIG. 3B, a seventh wiring 3317 of the first wiring layer 331 is arranged above the first interlayer insulating layer 311. The seventh wiring 3317 is connected to a seventh contact plug 327. The first wiring layer 331 is covered by a second interlayer insulating layer 312. According to the present exemplary embodiment, the contact plug is formed of tungsten, and the wiring is formed of aluminum. However, it is not limited thereto.

Referring to FIG. 1A, the photoelectric conversion device 100 includes a signal processing unit 140 for processing the electric signal generated by the signal generation unit 130. Further, the photoelectric conversion device 100 may include an output unit 150 for outputting to the outside the signal processed by the signal processing unit 140, and a control unit 160 for controlling the signal generation unit 130 and the signal processing unit 140.

According to the present exemplary embodiment, the signal processing unit 140, the output unit 150, and the control unit 160 are arranged in a peripheral circuit region 103 surrounding the photoelectric conversion region 101. However, at least a portion of the signal processing unit 140 may be arranged in the photoelectric conversion region 101.

Referring to FIG. 1A, the region between the dashed-dotted line and a dashed-two dotted line is the peripheral circuit region 103. According to the present exemplary embodiment, the signal processing unit 140 includes an amplifying circuit 141 having a plurality of column amplifiers, a conversion circuit 142 having a plurality of column analog/digital (AD) converters, and a horizontal scanning circuit 143 for selecting from the conversion circuit 142 and outputting to the output unit 150 the output. The output unit 150 includes an electrode pad and a protective circuit, and the control unit 160 includes a vertical scanning circuit 161 and a timing generation circuit 162. The peripheral circuit region 103 may be designed as appropriate.

The signal processing unit 140 is formed of a plurality of transistors. FIGS. 2, 3A, and 3B illustrate examples of the transistors in the signal processing unit 140 arranged in the peripheral circuit region 103.

The amplifying transistor 132 and the reset transistor 133, i.e., the first conductive type transistors in the signal generation unit 130, will be collectively referred to as a first transistor. If the above-described selection transistor is of the first conductive type, the selection transistor may also be the first transistor.

Further, the amplifying gate electrode 1320 and the reset gate electrode 1330 will be collectively referred to as a first gate electrode. The first gate electrode is the gate electrode of the first transistor. Furthermore, the transistor having the transfer gate 120 as the gate, the first semiconductor region 111 of the photoelectric conversion element 110 as the source, and the fifth semiconductor region 135 of the signal generation unit 130 as the drain, is a first transistor of the first conductive type. The transfer gate electrode 121 is the first gate electrode of the first transistor.

The signal processing unit 140 may be formed of a second transistor 170 of the first conductive type and a third transistor 180 of the second conductive type as illustrated in FIG. 2. The second transistor 170 and the third transistor 180 in the signal processing unit 140 both have different structure and characteristics from that of the first transistor in the signal generation unit 130.

FIG. 3A illustrates the second transistor 170 of the first conductive type, and FIG. 3B illustrates the third transistor 180 of the second conductive type. The second transistor 170 of the first conductive type and the third transistor 180 of the second conductive type are similarly structured except that they have the opposite conductive types.

According to one aspect a second gate electrode 171, i.e., the gate electrode of the second transistor 170, may be formed of polysilicon of the first conductive type, and a third gate electrode 181, i.e., the gate electrode of the third transistor 180, may be formed of polysilicon of the second conductive type.

Further, according to one aspect a first conductive type impurity concentration in the second gate electrode 171 may be higher than the first conductive type impurity concentration in at least one of the transfer gate electrode 121, the reset gate electrode 1330, and the amplifying gate electrode 1320. Furthermore, the first conductive type impurity concentration in the second gate electrode 171 may be greater than or equal to 3/2 times the first conductive type impurity concentration in one of the transfer gate electrode 121, the reset gate electrode 1330, and the amplifying gate electrode 1320.

Moreover, according to one aspect the sheet resistance of the second gate electrode 171 may be smaller than the sheet resistance of at least one of the transfer gate electrode 121, the reset gate electrode 1330, and the amplifying gate electrode 1320. Further, the sheet resistance of the second gate electrode 171 may be smaller than or equal to 2/3 of the sheet resistance of at least one of the transfer gate electrode 121, the reset gate electrode 1330, and the amplifying gate electrode 1320.

Furthermore, according to one aspect the second conductive type impurity concentration in the third gate electrode 181 may be higher than the first conductive type impurity concentration in at least one of the transfer gate electrode 121, the reset gate electrode 1330, and the amplifying gate electrode 1320. Moreover, according to one aspect the second conductive type impurity concentration in the third gate electrode 181 may be greater than or equal to 3/2 times the first-conductive type impurity concentration in at least one of the transfer gate electrode 121, the reset gate electrode 1330, and the amplifying gate electrode 1320.

Further, according to one aspect the sheet resistance of the third gate electrode 181 may be smaller than the sheet resistance of at least one of the transfer gate electrode 121, the reset gate electrode 1330, and the amplifying gate electrode 1320. Furthermore, the sheet resistance of the third gate electrode 181 may be smaller than or equal to 2/3 of the sheet resistance of at least one of the transfer gate electrode 121, the reset gate electrode 1330, and the amplifying gate electrode 1320. Generally, the sheet resistance of polysilicon is inversely proportional to the impurity concentration.

According to one aspect at least one the first conductive type impurity concentration in the second gate electrode 171 and the second-conductive type impurity concentration in the third gate electrode 181 may be a value from $1\times10^{21}$ atoms/cm$^3$ to $1\times10^{22}$ atoms/cm$^3$. Further, the first conductive type impurity concentration in at least one of the transfer gate electrode 121, the reset gate electrode 1330, and the amplifying gate electrode 1320 may be a value from $1\times10^{21}$ atoms/cm$^3$ to $1\times10^{22}$ atoms/cm$^3$.

According to one aspect the sheet resistance of at least one of the second gate electrode 171 and the third gate electrode 181 to be smaller than or equal to 1000 Ω/sq., such as smaller than or equal to 500 Ω/sq. Further, the sheet resistance of at least one of the transfer gate electrode 121, the reset gate electrode 1330, and the amplifying gate electrode 1320 may be less than or equal to 1000 Ω/sq. Generally, the sheet resistances of the transfer gate electrode 121, the reset gate electrode 1330, the amplifying gate electrode 1320, the second gate electrode 171, and the third gate electrode 181 are greater than or equal to 10 Ω/sq.

If the impurity concentration in the second gate electrode 171 and the third gate electrode 181 are increased and the resistances are decreased, the second transistor 170 and the third transistor 180 can stably operate. The second transistor 170 and the third transistor 180 can be effectively used as the conversion circuit 142 for the following reason. Since the conversion circuit 142 is a digital circuit, a voltage signal of higher frequency is input to the second gate electrode 171 in the second transistor 170 and the second gate electrode 181 in the third transistor 180 as compared to the reset transistor 133 and the transfer gate 120.

Further, since the second transistor 170 and the third transistor 180 are driven at high speed, the second transistor 170 and the third transistor 180 are effective when the voltage signal with lower amplitude as compared to the gate voltage of the reset transistor 133 is applied thereto. For example, peak values of the gate voltages of the reset transistor 133, and the transistors in the amplifying circuit 141, the horizontal scanning circuit 143, and the vertical scanning circuit 161 are set to 3.3 V. Further, the peak value of the gate voltage of the transistor in the conversion circuit 142 is set to 1.8 V. If the amplitude of the gate voltage is small, there is a notable effect even if there is little characteristic variation between the transistors. However, if the impurity concentration is increased, the characteristic variation can be reduced.

According to one aspect the film thickness of the gate insulation film 172 in the second transistor 170 may be smaller than the film thickness of the gate insulation film 122 in the transfer gate 120. Further, according to one aspect the film thickness of the gate insulation film 172 in the second transistor 170 may be smaller than the film thickness of the gate insulation film 122 in the first transistor.

According to the present exemplary embodiment, a portion of the drain 175 of the second transistor 170 is covered by a silicide layer 177. The silicide layer 177 of the second transistor 170 contacts the drain 175. The source 174 is similarly covered by and contacts the silicide layer 177.

Further, the top surface of the second gate electrode 171 is covered by a silicide layer 176. At least one of the silicide layer 177 covering the source 174 and the drain 175, and the silicide layer 176 covering the top surface of the second gate electrode 171, may be omitted. The source 184, the drain 185, and the third gate electrode 181 in the third transistor 180 are similarly configured.

According to the present exemplary embodiment, the second gate electrode 171 and the third gate electrode 181 are integrated as illustrated in FIG. 2. A peripheral gate electrode 190 which is integrally formed thus includes a first conductive type portion (i.e., the second gate electrode 171) and a second conductive type portion (i.e., the third gate electrode 181). Further, the first conductive type portion and the second conductive type portion in the peripheral gate electrode 190 may form the p-n junction.

According to the present exemplary embodiment, the top surface of the peripheral gate electrode 190 is covered by the silicide layer 176 from the first conductive type portion to the second conductive type portion of the peripheral gate electrode 190. The first conductive type portion and the second conductive type portion are thus shortened by the silicide layer 176. As a result, it prevents the operations of the second transistor 170 and the third transistor 180 to be unstable due to the p-n junction formed in the peripheral gate electrode 190.

Further, the second transistor 170 includes a side wall spacer 173 contacting a side surface of the second gate electrode 171. According to the present exemplary embodiment, the side wall spacer 173 has a two-layer structure, including a first dielectric layer 1731 and a second dielectric layer 1732 located between the second gate electrode 171 and the semiconductor substrate 1.

For example, the first dielectric layer 1731 is formed of silicon nitride, and the second dielectric layer 1732 is formed of silicon oxide. According to one aspect the electric permittivity of the second dielectric layer 1732 is be lower than that of the first dielectric layer 1731. However, the relation may be inversed.

According to the present exemplary embodiment, the gate insulation film 172 is extended from between the semiconductor substrate 1 and the second gate electrode 171 to between the semiconductor substrate 1 and the side wall spacer 173. However, the gate insulation film 172 may be arranged only between the semiconductor substrate 1 and the second gate electrode 171, so that the side wall spacer 173 may contact the semiconductor substrate 1.

A low concentration portion 1752 of the drain 175 is located below the side wall spacer 173. The first conductive type impurity concentration is lower in the low concentration portion 1752 as compared to the other portion of the drain 175 (i.e., a high concentration portion 1751). The drain 175 thus has a lightly doped drain (LDD) structure.

The side wall spacer 173 and the low concentration portion 1752 in the drain 175 may be omitted. Further, the source 174 may similarly have the low concentration portion and the high concentration portion. Furthermore, the drain 185 of the third transistor 180 may similarly have a high concentration portion 1851 and a low concentration portion 1852.

The second transistor 170 and the third transistor 180 are covered by a second intermediate film 240 which is different from the first intermediate film 210. More specifically, the second intermediate film 240 covers the source 174 and the drain 175 of the second transistor 170, and the top surface of the second gate electrode 171 along the side wall spacer 173.

According to the present exemplary embodiment, the silicide layer 177 is located between the second intermediate layer 240 and the drain 175, and the silicide layer 176 is located between the second intermediate film 240 and the top surface of the second gate electrode 171. Further, the side wall spacer 173 is located between the second intermediate film 240 and the side surface of the second gate electrode 171. According to one aspect for the second intermediate film 240 to be formed of silicon oxide. The second conductive type third transistor 180 is similarly configured.

The second transistor 170 and the third transistor 180 are covered by a third protective film 250. More specifically, the third protective film 250 covers the source 174 and the drain 175 of the second transistor 170, and the top surface of the second gate electrode 171 along the side wall spacer 173.

According to the present exemplary embodiment, the silicide layer 177 is located between the third protective film 250 and the drain 175, and the silicide layer 176 is located between the third protective film 250 and the top surface of the second gate electrode 171. Further, the side wall spacer 173 is located between the third protective film 250 and side surface of the second gate electrode 171. According to one aspect the third intermediate film 250 may be formed of silicon nitride.

As described above, the second intermediate film 240 is arranged between the third protective film 250 and the semiconductor substrate 1, and between the third protective film 250 and the second gate electrode 171. The film thickness of the third protective film 250 to be greater than that of the second intermediate film 240.

The first interlayer insulating layer 311 and the second interlayer insulating layer 312 of the insulation film 310 extend from the photoelectric conversion region 101 to the peripheral circuit region 103 and covers the semiconductor substrate 1. According to the present exemplary embodiment, the second intermediate film 240 and the third protective film 250 are located between the insulating layer 310 of the peripheral circuit region 103 and the semiconductor substrate 1 and between the insulating layer 310 and the second gate electrode 171. However, at least one of the second intermediate film 240 and the third protective film 250 may be omitted.

As illustrated in FIGS. 2 and 3A, the source 174 and the drain 175 of the second transistor 170 are each connected via the silicide layer 177 to the fourth contact plug 324 and the sixth contact plug 326.

The second gate electrode 171 is similarly connected via the silicide layer 176 to the fifth contact plug 325. The fourth contact plug 324, the fifth contact plug 325, and the sixth contact plug 326 each contact the third protective film 250 and the second intermediate film 240, and penetrate through the third protective film 250 and the second intermediate film 240.

As illustrated in FIGS. 2 and 3B, the source 184 and the drain 185 of the third transistor 180 are respectively connected via the silicide layer 177 to the eighth contact plug 328 and the ninth contact plug 329.

The third gate electrode 181 is similarly connected via the silicide layer 176 to the fifth contact plug 325. The eighth contact plug 328 and the ninth contact plug 329 respectively contact and penetrate through the third protective film 250 and the second intermediate film 240.

Contact resistance between the second gate electrode 171 and the fifth contact plug 325 is reduced, and the second transistor 170 can be driven at high speed by arranging the silicide layer 176. Further, the contact resistance between the drain 175 and the sixth contact plug 326 is reduced, and the second transistor 170 can be driven at high speed by arranging the silicide layer 177.

The source 174 and the fourth contact plug 324 are similarly configured, and the third transistor 180 can be similarly driven at high speed. On the other hand, according to one aspect the silicide layer is not formed at least above the transfer gate electrode 121 in the photoelectric conversion region 101 for preventing the noise due to metal contamination.

As illustrated in FIG. 3A, a fourth wiring 3314, a fifth wiring 3315, and a sixth wiring 3316 of the first wiring layer 3314 are arranged above the first interlayer insulating layer 311. The fourth wiring 3314, the fifth wiring 3315, and the sixth wiring 3316 are respectively connected to the fourth contact plug 324, the fifth contact plug 325, and the sixth contact plug 326.

Further, as illustrated in FIG. 3B, an eighth wiring 3318 and a ninth wiring 3319 of the first wiring layer 331 are arranged above the first interlayer insulating layer 311. The eighth wiring 3318 and the ninth wiring 3319 are respectively connected to the eighth contact plug 328 and the ninth contact plug 329. According to the present exemplary embodiment, the contact plugs are formed of tungsten, and the wiring is formed of aluminum. However, it is not limited thereto.

Figure 4A:
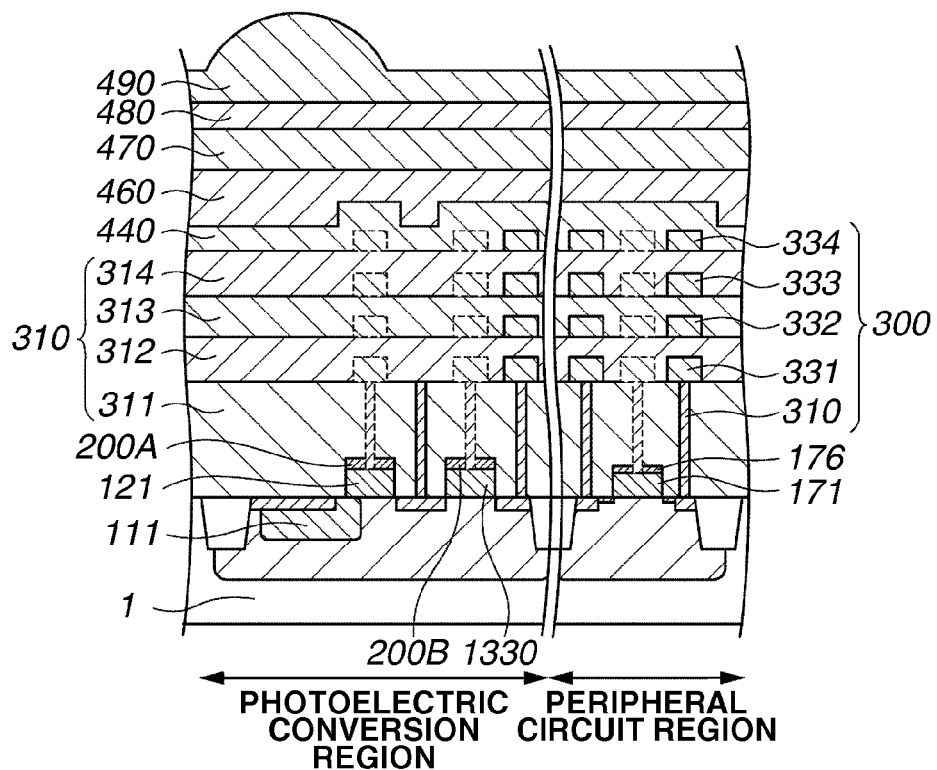
FIG. 4A is a cross-sectional view illustrating the photoelectric conversion device according to a first exemplary embodiment of the present invention.

FIG. 4A is a cross-sectional view illustrating an example of the photoelectric conversion device according to the first exemplary embodiment. The protective film and the intermediate film between the insulation film 310 and the semiconductor substrate 1, and a control film are omitted in FIG. 4A for ease of description.

A wiring structure 300 includes the insulation film 310 and a plurality of wiring layers (i.e., four layers including the first wiring layer 331, a second wiring layer 332, a third wiring layer 333, and a fourth wiring layer 334). According to the present exemplary embodiment, the insulation film 310 includes the first interlayer insulating layer 311, the second interlayer insulating layer 312, the third interlayer insulating layer 313, and the fourth interlayer insulating layer 314.

A passivation film 440 is arranged above the wiring structure 300. A general passivation film 440 includes a silicon nitride layer. According to one aspect, there is formed above and below the silicon nitride layer in the passivation film a silicon oxynitride layer which is thinner than the silicon nitride layer.

A first planarization film 460 formed of resin is arranged above the passivation film 440, and a color filter is formed above the first planarization film 460. According to the present exemplary embodiment, there is one color filter. However, a color filter array in which a plurality of types of color filters, of either elementary colors or complementary colors, are regularly-arranged according to the arrangement of the photoelectric conversion element 110, is formed in the photoelectric conversion region 101.

A second planarization film 480 formed of resin is arranged above the color filter 470, and the top surface thereof is flat. A micro lens 490 is arranged above the second planarization film 480. The micro lens 490 may include antireflection coating.

According to the present exemplary embodiment, one micro lens is illustrated. However, a micro lens array in which a plurality of micro lenses is regularly-arranged according to the arrangement of the photoelectric conversion element 110 is configured in the photoelectric conversion region 101.

Figure 4B:
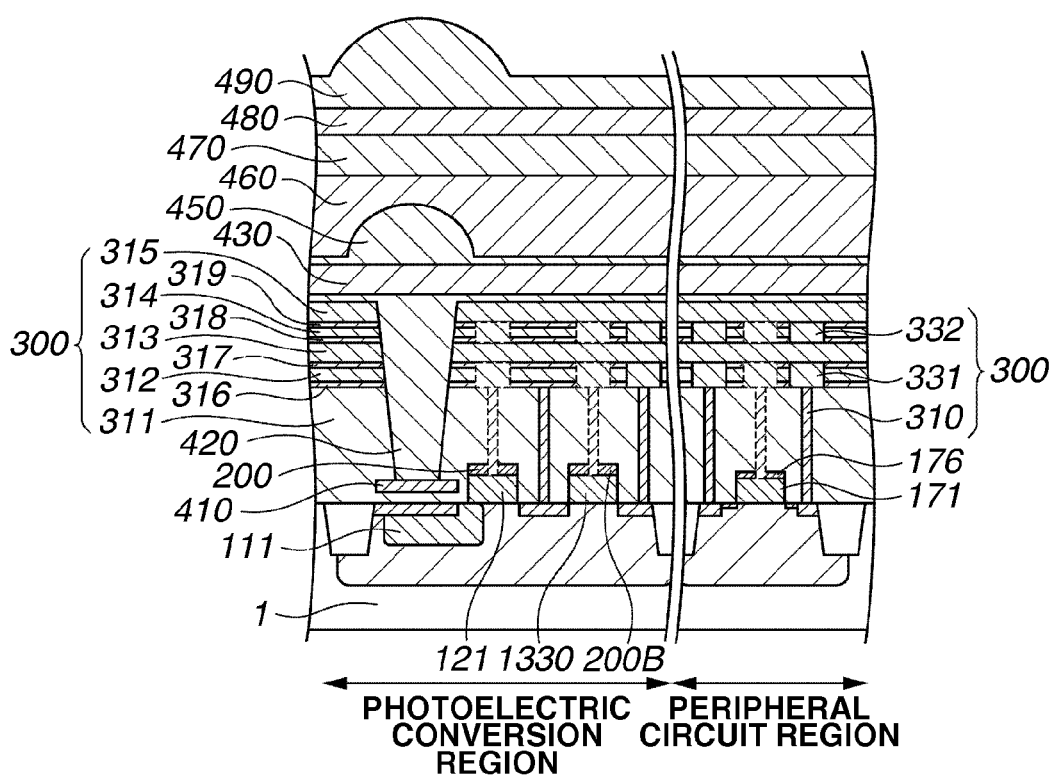
FIG. 4B is a cross-sectional view illustrating a photoelectric conversion device according to a second exemplary embodiment of the present invention.

FIG. 4B is a cross-sectional view illustrating an example of the photoelectric conversion device 100 according to a second exemplary embodiment of the present invention. The protective film and the intermediate film between the insulation film 310 and the semiconductor substrate 1, and the control film are omitted in FIG. 4A for ease of description.

The wiring structure 300 includes the insulation film 310 and a plurality of wiring layers (i.e., two layers including the first wiring layer 331 and the second wiring layer 332). According to the present exemplary embodiment, the insulation film 310 includes the first interlayer insulating layer 311, the second interlayer insulating layer 312, the third interlayer insulating layer 313, the fourth interlayer insulating layer 314, and a fifth interlayer insulating layer 315. Further, the insulation film 310 includes a first interlayer separating layer 316, a second interlayer separating layer 317, a third interlayer separating layer 318, and a fourth interlayer separating layer 319.

According to one aspect each interlayer insulating layer may be formed of silicon oxide and each interlayer separating layer to be formed of silicon nitride. The interlayer separating layer reduces diffusion of metal materials, and functions as an etching stopper when forming the wiring layer. The interlayer separating layer may be thinner than the interlayer insulating layer.

A light guide member 420 surrounded by the insulation film 310 has a high refractive index of the interlayer insulating layers 311, 312, 313, 314, and 315. The light guide member 420 has an optical waveguide structure using the interlayer insulating layers 311, 312, 313, 314, and 315 as a clad and the light guide member 420 as a core. The light guide member 420 is extended over the top surface of the insulation film 310. However, it is not necessary for the light guide member 420 to be extended over the top surface of the insulation film 310. Further, the light guide member 420 may be formed of silicon nitride.

A light condensing film 430 is formed above the light guide member 420, and an inner-layer lens 450 is formed above the light condensing film 430. The inner-layer lens 450 may have the antireflective coating.

An inner-layer lens array in which a plurality of inner-layer lenses is regularly-arranged according to the arrangement of the photoelectric conversion element 110 is configured in the photoelectric conversion region 101. The inner-layer lens 450 may be formed of silicon nitride.

The light condensing film 430 has a lower refractive index as compared to the inner-layer lens 450. As a result, incident light which obliquely enters the light condensing film 430 from the inner-layer lens 450 can be condensed towards the light guide member 420 by refraction inside the light condensing film 430. A light condensing film 430 may include a silicon oxide layer. The light condensing film to include an intermediate refractive index layer having a refractive index which is between the refractive indices of the silicon oxide layer and the light guide member 420, arranged between the silicon oxide layer and the light guide member 420.

Further, according to one aspect the light condensing film 430 may include an intermediate refractive index layer having a refractive index which is between the refractive indices of the silicon oxide layer and the inner-layer lens 450, arranged between the silicon oxide layer and the inner-layer lens 450. The intermediate refractive index layers in the light condensing film 430 are capable of reducing reflection between the silicon oxide layer and the light guide member 420 or between the silicon oxide layer and the inner-layer lens 450.

If the light guide member 420 and the inner-layer lens 450 are formed of silicon nitride, the intermediate refractive index layer may be formed of silicon oxynitride. Further, the intermediate refractive index layer may be thinner than the silicon oxide layer.

The first planarization film 460 formed of resin is arranged above the inner-layer lens 450, and the top surface thereof is flat. Since the configurations of the color filter 470 and the second planarization film 480 are the same as those illustrated in FIG. 4A according to the first exemplary embodiment, description will be omitted.

Further, the photoelectric conversion device 100 may be a backside illumination type in which the color filter array and the lens array are arranged on the opposite side of the insulation film 310 with respect to the semiconductor substrate 1.

An imaging system can be configured using the above-described photoelectric conversion device 100. The imaging system may be a camera such as a still camera or a video camera.

Further, the imaging system may be an information terminal including a camera function. The imaging system includes at least one of the image processing unit, such as an image processing engine which processes the image based on the electric signal generated by the signal generation unit 130, or an image display unit, such as a liquid crystal display which displays the image.

A method for manufacturing the semiconductor device according to the present exemplary embodiment will be described below. A first aspect of the present exemplary embodiment is related to the first transistor included in the signal generation unit 130, and the second transistor 170 included in the signal processing unit 140 as will be described below. A gate insulation film of the second transistor 170 may be thinner than a gate insulation film of the first transistor.

According to the manufacturing method of the first aspect, the first gate electrode in the first transistor is formed using the first members 200B and 200C as masks, and the second gate electrode of the second transistor 170 is formed using the second member 207 as the mask. Further, the drain of the first transistor is formed using the first members 200B and 200C as the masks.

In such a case, the first members 200B and 200C reduce introduction of impurity to the first gate electrode. The second member 207 is thinned, and the drain 175 in the second transistor 170 is then formed. In parallel with the formation of the drain 175, ion implantation is performed on the second gate electrode 171 of the second transistor 170. As a result, the impurity concentration in the gate electrodes of each of the first transistor and the second transistor can be controlled.

A second aspect of the present exemplary embodiment relates to the first transistor including the transfer gate 120, and the second transistor 170 included in the signal processing unit 140. A gate insulation film of the second transistor 170 may be thinner than a gate insulation film of the first transistor. According to the manufacturing method of the second aspect, the transfer gate electrode 121 is formed using the first member 200A as the mask, and the second gate electrode is formed using a second member 200D as the mask.

Further, the fifth semiconductor region 135 is formed using the first member 200A as the mask. In such a case, the first member 200A reduces the introduction of the impurity to the transfer gate electrode 121. The second member 207D is thinned, and the drain 175 in the second transistor 170 is then formed.

In parallel with the formation of the drain 175, ion implantation is performed on the second gate electrode 171 in the second transistor 170. As a result, the impurity concentration in the gate electrodes in each of the transfer gate 120 and the second transistor can be controlled.

The method for manufacturing the photoelectric conversion device 100 will be described in detail below with reference to the example of the photoelectric conversion device 100 according to the first exemplary embodiment illustrated in FIG. 4A.

The reset transistor 133 will be mainly described below as an example of the first transistor with respect to the first aspect of the present exemplary embodiment. However, a similar manufacturing method can be employed in the case where the first transistor is replaced by the amplifying transistor 132.

Further, a similar manufacturing method may be employed in the case where the transfer gate 120 in the first transistor is regarded as the gate, the photoelectric conversion element 110 as the source, and the fifth semiconductor region 135 as the drain. Since the characteristic variation of the amplifying transistor 132 may cause a fixed pattern noise, it is effective to arrange the first member 200C above the amplifying gate electrode 1320.

Furthermore, if the impurity concentrations in the transfer gate electrode 121 and the reset gate electrode are high, a leak current is likely to be generated as a result of polysilicon depletion. To prevent such a problem, it is effective to arrange the first member 200A above the transfer gate electrode 121 that handles the signal charge and the second member 200B above the reset gate electrode 1330.

Process A will be described below with reference to FIG. 5A. The semiconductor substrate 1 of the first conductive type is provided, and the isolation region 3 which defines the first active portion 2A of the semiconductor substrate 1 is formed in the photoelectric conversion region. Further, the isolation region 3 which defines the second active portion 2B of the semiconductor substrate 1 is formed in the peripheral circuit region. According to the present exemplary embodiment, the isolation region in the photoelectric conversion region and the isolation region in the peripheral circuit region both have the STI structure. However, at least one of the isolation regions may have the LOCOS structure, or the diffusion isolation structure.

Ion implantation of the second conductive type impurity is then performed on the first active portion 2A, so that at least a portion of the second semiconductor region 112 and the fourth semiconductor region 134, both of the second conductive type, is formed on the first active portion 2A. Further, ion implantation of the second conductive type impurity is performed on the second active portion 2B, so that at least a portion of a well region 178 of the second conductive type is formed on the second active portion 2B.

Figure 5A:
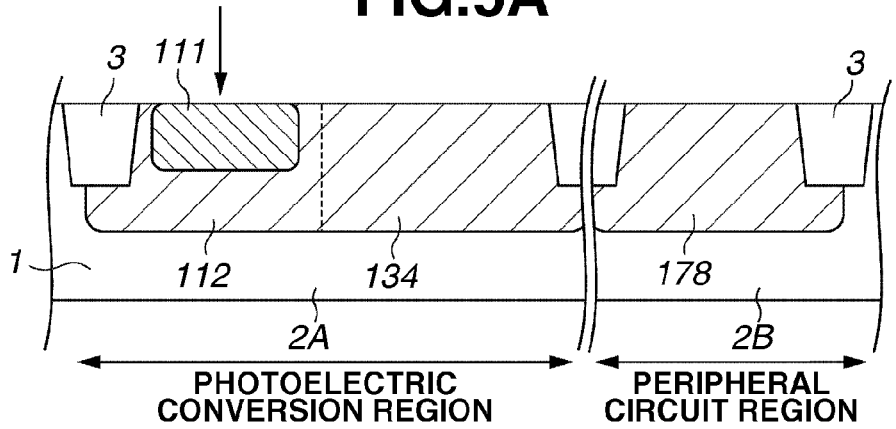

In the example illustrated in FIG. 5A, all of the second semiconductor region 112 and the fourth semiconductor region 134, and all of the well region 178 are formed. However, according to the present exemplary embodiment, a portion of the second semiconductor region 112 and the fourth semiconductor region 134 and/or the well region 178 may be formed in process A. The remaining portions of the second semiconductor region 112 and the fourth semiconductor region 134 and/or the well region 178 may be formed in process E and thereafter.

According to the present exemplary embodiment, the first semiconductor region 111 of the first conductive type to be the accumulation region of the photoelectric conversion element 110 is formed on the first active portion 2A in process A. However, the first semiconductor region 111 may be formed in process E and thereafter.

<Process B>

Process B will be described below with reference to FIG. 5B. In a first step, an insulation film 22 to be used as the gate insulation films 122 and 172 is formed on the semiconductor substrate 1. According to one aspect the thickness of the insulation film 22 may be 1 nm to 15 nm. According to the present exemplary embodiment, the semiconductor substrate 1 formed of silicon is thermally-oxidized to form a silicon oxide film.

The thickness of the portion of the silicon oxide film corresponding to the gate insulation film 172 of the second transistor 170 is then decreased as compared to the thickness of the portion corresponding to the gate insulation film 122 of the reset transistor 133.

The surface of the silicon oxide film is then oxynitrized, so that the insulation film 22 to be used for the gate insulation films 122 and 172 having the silicon oxide layer and the silicon oxynitride layer is formed. The insulation film 22 is not limited to the above-described structure and forming method. The thicknesses of the gate insulation film 122 of the reset transistor 133 and the insulation film 172 of the second transistor 170 may be the same. Further, the insulation film 22 may be a single-layer film of the silicon oxide layer without oxynitrizing the silicon oxide film.

Furthermore, the gate insulation film 122 in the reset transistor 133 and the insulation film 172 in the second transistor 170 may be separately formed so that the thicknesses become different. Moreover, the gate insulation film may be formed by accumulating on the semiconductor substrate, a high-k material such as hafnium oxide.

In a second step, a polysilicon film 21 is formed on the insulation film 22. The thickness of the polysilicon film 21 may be 50 nm to 500 nm. According to the present exemplary embodiment, the polysilicon film 21 is formed by accumulating non-dope polysilicon. Ion-implantation of the first conductive type impurity is performed in the portion corresponding to the transfer gate electrode 121, the reset gate electrode 1330, and the second gate electrode 171 in the polysilicon film 21. A first photo-resist pattern is used as a mask in performing ion implantation. The first photo-resist pattern is then removed, and a second photo-resist pattern is used as the mask to perform ion implantation of the second conductive type impurity on the portion corresponding to the third gate electrode 181 in the polysilicon film 21.

According to the present exemplary embodiment, a dose amount of each ion implantation is set to be a value from $1\times10^{15}$ ions/cm$^2$ to $1\times10^{16}$ ions/cm$^2$, such as from $1\times10^{15}$ ions/cm$^2$ to $6\times10^{15}$ ions/cm$^2$ in process B. Further, the impurity concentration in the polysilicon film 21 as a result of performing each ion implantation may be a value from $1\times10^{21}$ ions/cm$^3$ to $1\times10^{22}$ ions/cm$^3$.

The polysilicon film 21 can be formed by accumulating doped polysilicon, and so that the impurity concentration becomes the same level as the above-described impurity concentration. However, since the portion corresponding to the third gate electrode 181 may be of the second conductive type, it may be the case that non-dope polysilicon is accumulated instead of the doped polysilicon.

In a third step, the insulation film 20 is formed on the polysilicon film 21. An inorganic insulating material may be used for forming the insulation film 20, so that the insulation film 20 becomes an inorganic insulation film. In such a case, silicon compounds such as silicon oxide, silicon oxynitride, silicon nitride, and silicon carbide can be used as the material of the insulation film 20.

The insulation film 20 may also be an organic insulation film, using an organic insulation material such as polyimide which has higher resistance to chemicals and heat as compared to a general photo-resist. The insulation film 20 may be a multi-layer film.

According to one aspect the thickness of the insulation film 20 may be less than the thickness of the polysilicon film 21, i.e., smaller than or equal to half the thickness of the polysilicon film 21. The thickness of the insulation film 20 may have a value from 10 nm to 100 nm.

FIG. 2 illustrates a length L and a width W of the transfer gate electrode 121. The length of each gate electrode is the length of the gate electrode in a direction in which the gate length of the transistor is defined. Further, the width of each gate electrode is the width of the gate electrode in a direction in which the gate width of the transistor is defined. The thicknesses of the first members 200A, 200B, and 200C, and the second member 207 may be smaller than the length of the gate electrode (L).

Further, according to one aspect the impurity may be introduced to the polysilicon film 21 before forming the insulation film 20. However, the impurity may be introduced to the polysilicon film 21 by performing ion implantation via the insulation film 20. In such a case, it may become necessary for implantation energy in performing ion implantation to be sufficiently high for the ion to pass through the insulation film 20.

In a fourth step, a patterned third photo-resist is formed on the insulation film 20. The third photo-resist is formed according to the layouts of the transfer gate electrode 121, the reset gate electrode 1330, the amplifying gate electrode 1320, the second gate electrode 171, and the third gate electrode 181.

Figure 5B:
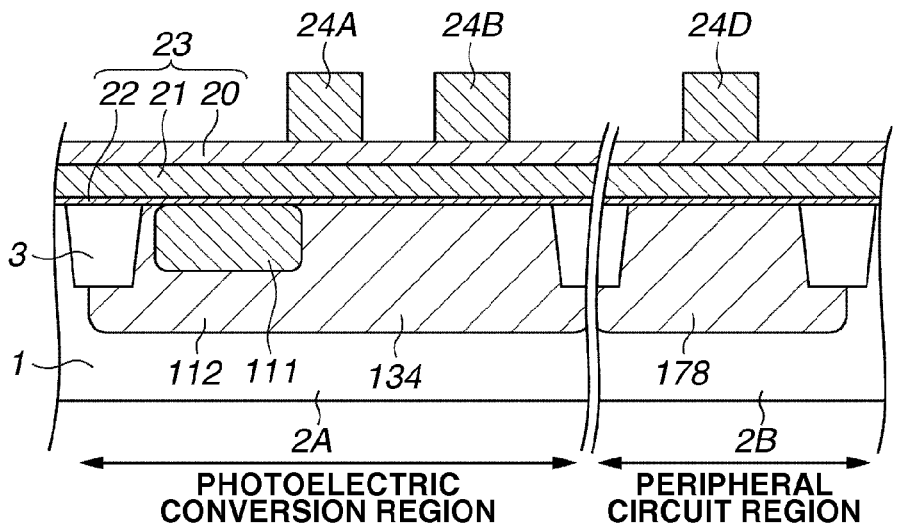

FIG. 5B illustrates a third photo-resist 24A corresponding to the transfer gate electrode 121, a third photo-resist 24B corresponding to the reset gate electrode 1330, and a third photo-resist 24D corresponding to the second gate electrode 171. The third photo-resist corresponding to the amplifying gate electrode 1320 and the third photo-resist corresponding to the third gate electrode 181 can also be formed at the same time.

<Process C>

Figure 5C:
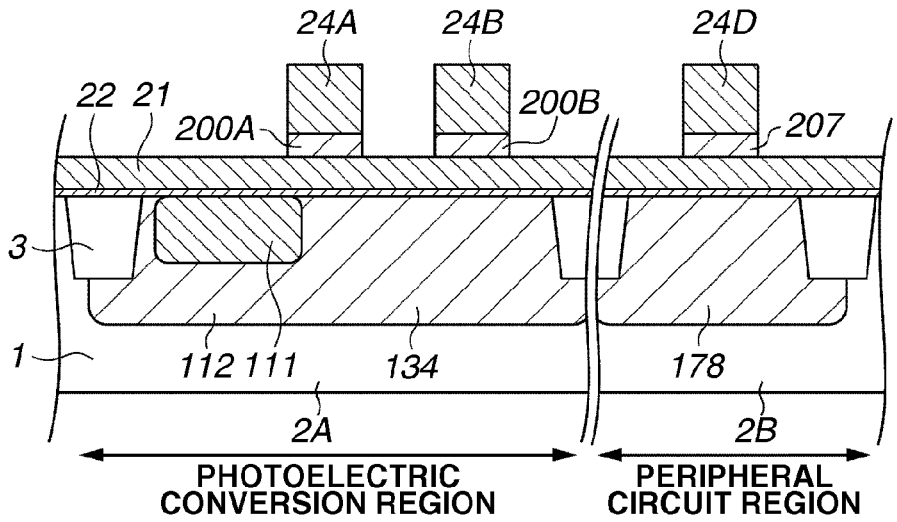

Process C according to the present exemplary embodiment will be described below with reference to FIG. 5C. The insulation film 20 is etched using the third photo-resists 24A, 24B, and 24D as the masks, so that patterning is performed on the insulation film 20. According to one aspect dry etching may be performed on the insulation film 20. As a result, the first member 200A arranged according to the layout of the transfer gate electrode 121 can be acquired from the insulation film 20.

Further, the first member 200B arranged according to the layout of the reset gate electrode 1330, and the second member 207 arranged according to the layout of the second gate electrode 171 can be acquired. Furthermore, the first member 200C (not illustrated) arranged according to the layout of the amplifying gate electrode 1320, and the second member (not illustrated) arranged according to the layout of the third gate electrode 181 can be acquired at the same time.

According to the present exemplary embodiment, the second gate electrode 171 and the third gate electrode 181 are integrated as described above with reference to FIG. 2. The second member 207 arranged according to the layout of the second gate electrode 171 and the second member arranged according to the layout of the third gate electrode 181 are thus integrally formed.

<Process D>

Process D according to the present exemplary embodiment will be described below with reference to FIG. 5D. The polysilicon film 21 is etched using as the masks the first members 200A, 200B, and 200C formed above the polysilicon film 21, so that patterning is performed on the polysilicon film 21.

The polysilicon film 21 is etched using as the mask the second member 207 formed above the polysilicon film 21, so that patterning is performed on the polysilicon film 21. As a result, the transfer gate electrode 121 and the reset gate electrode 1330 having flat shapes according to the shapes of the first members 200A and 200B are respectively formed. Further, the second gate electrode 171 having the flat shape according to the shape of the second member 207 is formed. Furthermore, the amplifying gate electrode 1320 and the third gate electrode 181 are formed at the same time.

According to the present exemplary embodiment, the second gate electrode 171 and the third gate electrode 181 are integrally formed as the peripheral gate electrode 190 as illustrated in FIG. 2. As described above in process A, the portion in the peripheral gate electrode 190 corresponding to the second gate electrode 171 is of the first conductive type, and the portion corresponding to the third gate electrode 181 is of the second conductive type.

The peripheral gate electrode 190 thus includes a first-conductive type portion (corresponding to the second gate electrode) and a second-conductive type portion (corresponding to the third gate electrode). Further, the first-conductive type portion and the second-conductive type portion may form the p-n junction.

According to one aspect, before patterning the polysilicon film 21, the third photo-resists 24A, 24B, and 24C used in process C are removed. However, the polysilicon film 21 may be etched using the third photo-resists 24A and 24B, and the first members 200A and 200B and/or the photo-resist 24C and the second member 207 as the masks.

Further, according to one aspect the transfer gate electrode 121, the reset gate electrode 1330, and the second gate electrode 171 may be formed at the same time. According to the present exemplary embodiment, at least an extended portion from the portion of the insulation film 22 between the gate electrode 121 and the semiconductor substrate 1 is exposed in process D. The extended portion of the insulation film 22 may be thinned. Further, the extended portion of the insulation film 22 may be completely removed, so that the semiconductor substrate 1 is exposed.

<Process E>

Process E according to the present exemplary embodiment will be described below with reference to FIG. 5E. The portion other than the second transistor 170 is covered by the fourth photo-resist (not illustrated). Ion implantation of the second conductive type impurity is then performed on the second active portion 2B of the semiconductor substrate 1 using the second member 207 and the second gate electrode 171 as the masks. The low concentration portion 1752 of the drain 175 in the second transistor 170 is thus formed.

The low concentration portion 1752 functions as the lightly doped drain (LDD). The low concentration portion 1742 of the source 174 in the second transistor 170 can also be formed at the same time. The fourth photo-resist is then removed.

The portion other than the reset transistor 133 is then covered by a fifth photo-resist (not illustrated). Ion implantation of the first conductive type impurity is performed on the first active portion 2A in the semiconductor substrate 1 using the first member 200B and the reset gate electrode 1330 as the masks. The drain 1332 in the reset transistor 133 is thus formed.

The fifth semiconductor region 135 which is the source of the reset transistor 133 and functions as the floating diffusion region can also be formed at the same time. The fifth photo-resist is then removed.

The portion other than the photoelectric conversion element 110 is covered by a sixth photo-resist (not illustrated). Ion implantation of the second conductive type impurity is then performed on the first active portion 2A of the semiconductor substrate 1, so that the third semiconductor region 133 to be the surface protection region of the photoelectric conversion member is formed. The sixth photo-resist is then removed.

The portion other than the third transistor 180 is covered by a seventh photo-resist (not illustrated). Ion implantation of the second conductive type impurity is then performed on the second active portion 2B of the semiconductor substrate 1 using the second member 207 and the third gate electrode 181 as the masks.

As a result, a low concentration portion 1852 (i.e., LDD) of the drain 185 in the third transistor 180 is formed. The low concentration portion of the source 184 in the third transistor 180 can also be formed at the same time. The seventh photo-resist is then removed.

A dose amount of each ion implantation may be set to be a value from $1 \times 10^{13}$ ions/cm$^2$ to $1 \times 10^{14}$ ions/cm$^2$ in process E. Further, the first members 200A, 200B, and 200C, and the second member 207 are used as the masks. It may thus be necessary for the implantation energy of each ion implantation to be of the level at which the ions do not actually pass through the first members 200A, 200B, and 200C, and the second member 207.

The low concentration portions 1752 and 1852 formed near the surface of the semiconductor substrate 1, and the implantation energy for forming the fifth semiconductor region 135 and the third semiconductor region 133 are determined according to the characteristics of each transistor. The thicknesses of the first members 200A, 200B, and 200C, and the second member 207, to be used as the masks can thus be determined as appropriate from the implantation energy.

The order of forming the low concentration portion 1752 of the drain 175, the drain 1332, the third semiconductor region 113, and the low concentration portion 1852 of the drain 175 is not limited to the above-described order.

<Process F>

Process F according to the present exemplary embodiment will be described below with reference to FIG. 5F. In process F, a silicon oxide film 1210 covering the photoelectric conversion region and the peripheral circuit region is formed. The thickness of the silicon oxide film 1210 may be smaller than the thickness of the first members 200A, 200B, and 200C, and the second member 207, and may be from 1 nm to 30 nm.

A silicon nitride film 1220 covering the photoelectric conversion region and the peripheral circuit region is formed above the silicon oxide film. The thickness of the silicon nitride film 1220 may be greater than the thickness of the silicon oxide film 1210, and may be from 10 nm to 100 nm.
<Process G>

Figure 5G:
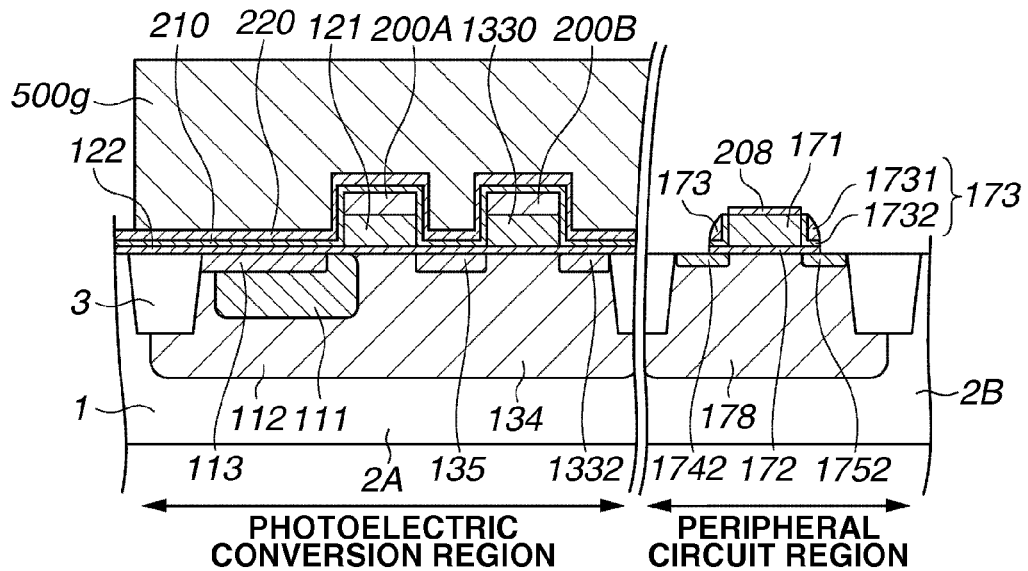

Process G according to the present exemplary embodiment will be described below with reference to FIG. 5G. According to the present exemplary embodiment, the second member 207 is thinned. The thickness of the second member 207 may be smaller than the thicknesses of the first members 200A, 200B, and 200C. The second member 207 may be completely removed.

More specifically, the photoelectric conversion region is covered by an eighth photo-resist 500g. The silicon nitride film 1220 and the silicon oxide film 1210 located above the second member 207 are sequentially etched, using the eighth photo-resist 500g as the mask. Further, the second member 207 is etched and thinned thereby.

The second member 207 may be etched until thin second member 207 is remaining, or until the second member 207 is completely removed until the second gate electrode 171 is exposed. The first members 200A, 200B, and 200C may also be thinned. The thin first member 200A, 200B, 200C may remain or the first members 200A, 200B, 200C may be completely removed so that the top surface of the reset gate electrode 133 is exposed. However, according to one aspect the first members 200A, 200B, and 200C do not become thin.

According to the present exemplary embodiment, the side wall spacer 173 of the second transistor 170 can be formed in association with etching the second member 207 in process G. According to the present exemplary embodiment, the side wall spacer 173 has the two-layer structure, i.e., the first dielectric layer 1731, which is a portion of the silicon nitride film 1220, and the second dielectric layer 1732, which is a portion of the silicon oxide film 1210.

The second dielectric layer 1732 is located between the first dielectric layer 1731 and the side surface of the second gate electrode 171. The permittivity of the second dielectric layer 1732 becomes lower than that of the first dielectric layer 1731 by employing the silicon nitride film 1220 and the silicon oxide film 1210.

In process F, a vertical relation between the silicon oxide film 1210 and the silicon nitride film 1220 can be reversed. In such a case, the permittivity of the second dielectric layer 1732 becomes higher than the permittivity of the first dielectric layer 1731.

The side wall spacer 173 of the third transistor 180 can be formed at the same time as forming the side wall spacer 173 of the second transistor 170. If the low concentration portion 1742 of the drain 174 or the side wall spacer 135 is not to be formed, the second member 207 can be thinned between performing process E and process D.
<Process H>

Figure 5H:
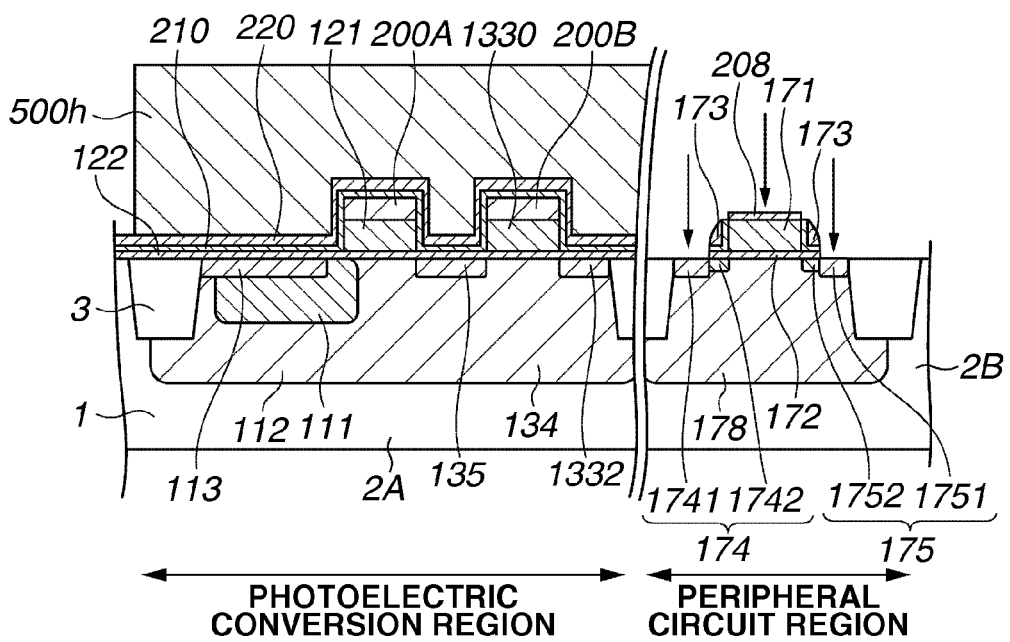

Process H according to the present exemplary embodiment will be described below with reference to FIG. 5H. In process H, a ninth photo-resist 500h which covers the photoelectric conversion region and the third transistor 180 and not the second transistor 170 is formed. The ion implantation of the first conductive type impurity is then performed on the second active portion 2B of the semiconductor substrate 1 using the second gate electrode 171 as the mask.

As a result, the high concentration portion 1751 of the drain 175 in the second transistor 170 is formed.

The drain 175 in the second transistor 170 including the low concentration portion 1752 described in process E and the high concentration portion 1751 formed in process H is thus formed. At the same time, the high concentration portion 1741 of the source 174 in the second transistor 170 can be formed, so that the source 174 in the second transistor 170 is formed. As described above, the second gate electrode 171 is exposed due to the second member 208 becoming thin as a result of process G, or due to the second member 208 being removed.

The impurity is thus introduced to the second gate electrode 171 at the same time as performing ion implantation for forming the high concentration portion 1751. That is, the ion implantation to the second gate electrode 171 is performed in parallel with forming the drain 175. The introduction of the impurity to the second gate electrode 171 may be caused collaterally to the formation of the forming the drain 175.

According to one aspect the ion implantation is performed so that the impurity concentration in the second gate electrode 171 becomes higher than the first conductive type impurity concentrations in the transfer gate electrode 121, the reset gate electrode 1330, and the amplifying gate electrode 1320 covered by the ninth photo-resist 500h. The dose amount of the ion implantation for forming the drain 175 in process H may be set to be a value from $1 \times 10^{15}$ ions/cm$^2$ to $1 \times 10^{16}$ ions/cm$^2$.

According to one aspect, the dose amount may be set to be a value from $1 \times 10^{15}$ ions/cm$^2$ to $6 \times 10^{15}$ ions/cm$^2$. In general, the dose amount of the ion implantation for forming the drain 175 is 10 to 1000 times the dose amount of the ion implantation performed in process E. The impurity concentrations in the transfer gate electrode 121, the reset gate electrode 1330, and the amplifying gate electrode 1320 are substantially regulated by the impurity concentration in the polysilicon film 21 described in process B.

The reason for the above is that, in process E, the first members 200A, 200B, and 200C are formed above the transfer gate electrode 121, the reset gate electrode 1330, and the amplifying gate electrode 1320. In other words, the first members 200A, 200B, and 200C function as the masks with respect to the gate electrode when performing ion implantation for forming the fifth semiconductor region 135, the drain 1332, the source 1321, and the drain 1322. The ion is thus not actually implanted in the transfer gate electrode 121, the reset gate electrode 1330, and the amplifying gate electrode 1320.

As a result, when ion implantation is performed in process H, the impurity concentration in the second gate electrode 171 can be higher than the impurity concentrations in the transfer gate electrode 121, the reset gate electrode 1330, and the amplifying gate electrode 1320. The implantation energy for forming the drain 175 is set in the ion implantation. Further, the thickness of the second member 208 in process G can be set so that ion can be implanted in the second gate electrode 171 using the implantation energy for forming the drain 175.

Further, a tenth photo-resist (not illustrated) which covers the photoelectric conversion region and the second transistor 170 and not the third transistor 180 is formed. Ion implantation of the second conductive type impurity is then performed on the third gate electrode 181 similarly as on the second transistor 170.

Furthermore, the high concentration portion 1851 of the drain 185 and the high concentration portion 1841 of the source 184 in the third transistor 180 are formed. The dose amount of ion implantation for forming the drain 185 in process H may be set to be a value from $1 \times 10^{15}$ ions/cm² to $1 \times 10^{16}$ ions/cm², such as from $1 \times 10^{15}$ ions/cm² to $6 \times 10^{15}$ ions/cm².

By performing the above-described process, ion implantation, which affects the operations of the transfer gate 120 and each transistor, is completed.

<Process I>

Figure 5I:
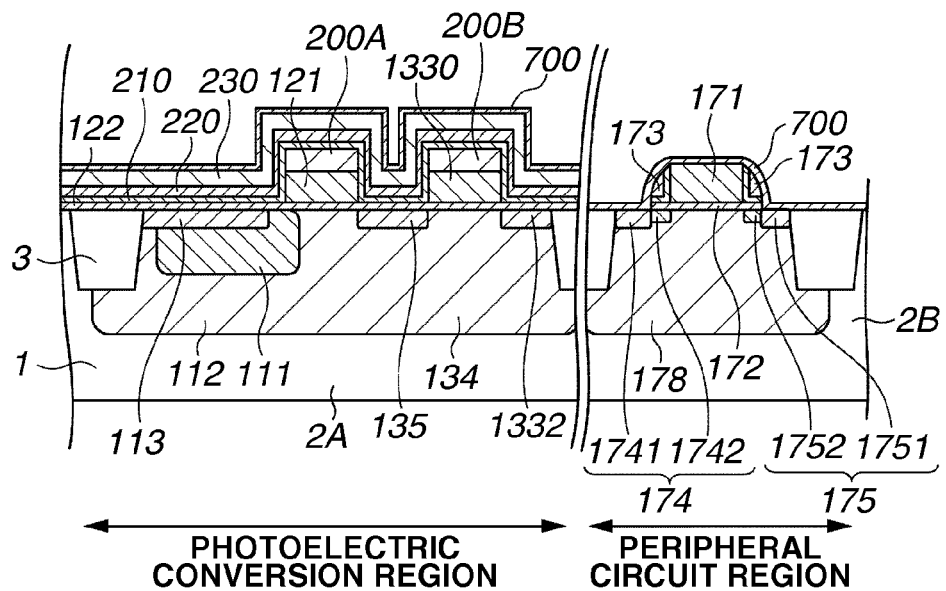

Process I according to the present exemplary embodiment will be described below with reference to FIG. 5I. In process I, the silicon oxide film is formed in the photoelectric conversion region and the peripheral circuit region. An eleventh photo-resist (not illustrated), which covers the photoelectric conversion region and not the peripheral circuit region, is formed above the silicon oxide film. The silicon oxide film is etched using the eleventh photo-resist as the mask, so that the top surface of the second gate electrode 171 in the second transistor 170 is exposed.

If the second member 207 is not completely removed in process G and remains above the second gate electrode 171 as the second member 208, the second member 208 is etched in process I so that the top surface of the second gate electrode 181 is exposed. The eleventh photo-resist is then removed. As a result, the second protective film 230 as a portion of the silicon oxide film is formed on the photoelectric conversion region which has been covered by the eleventh photo-resist.

A metal film 700 is then formed to contact the top surface of the second gate electrode 171, the source 174, and the drain 175 in the second transistor 170. The metal film 700 formed of a metal material such as cobalt, titanium, nickel, and tungsten, which can be silicided.

Further, the metal film 700 is formed to contact the top surface of the third gate electrode 181, and the source 184 and the drain 185 in the third transistor 180. In such a case, the metal film 700 is also formed in the photoelectric conversion region. However, the first protective film 220 and the second protective film 230 are located between the metal film 700 and the reset transistor 133, so that the metal film 700 does not contact the reset transistor 133 and the transfer gate electrode 121.

<Process J>

Figure 5J:
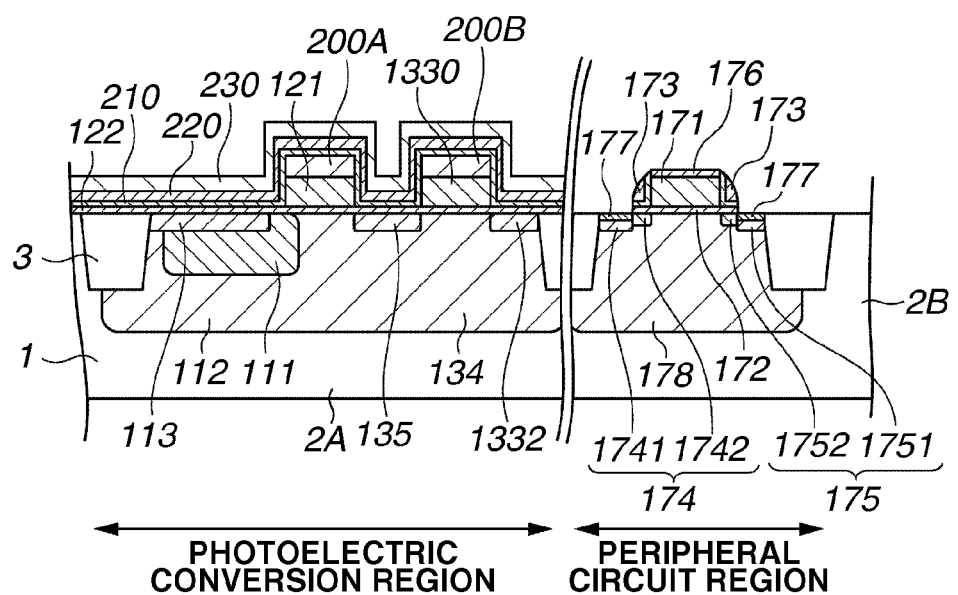

Process J according to the present exemplary embodiment will be described below with reference to FIG. 5J. In process J, the metal film 700 and the second gate electrode 171 are heat-reacted by heating the semiconductor substrate 1, so that the top surface of the second gate electrode 171 is silicided. The silicide layer 176 is thus formed above the second gate electrode 171. At the same time, the metal film 700 and the source 174 and the drain 175 in the second transistor 170 can be silicided, and the silicide layer 177 can thus be formed above the source 174 and the drain 175.

The third transistor 180 can be similarly silicided. The non-reacting metal film 700 located in the photoelectric conversion region is then removed. The silicide layers 177 and 176 can be further heated to lower the resistance thereof.

<Process K>

Figure 5K:
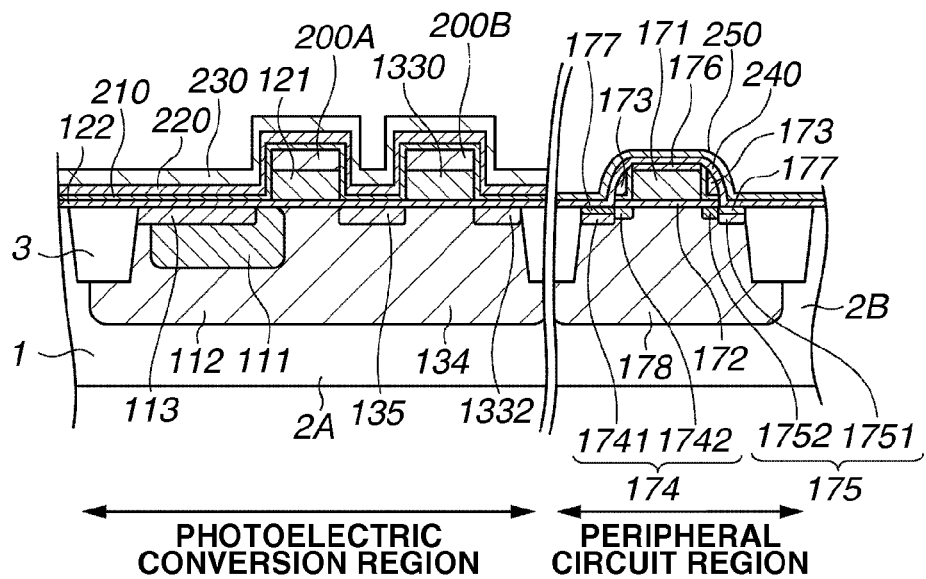

Process K according to the present exemplary embodiment will be described below with reference to FIG. 5K. In process K, the silicon oxide film which covers the photoelectric conversion region and the peripheral circuit region, and contacts the side wall spacer 173 and the silicide layers 176 and 177 is formed.

The silicon nitride film covering the photoelectric conversion region and the peripheral circuit region is then formed above the silicon oxide film, and the portion of the silicon nitride film located in the photoelectric conversion region is removed. The third protective film 250 is thus formed in the peripheral circuit region. Further, the second intermediate film 240 is formed in the peripheral circuit region by removing the portion of the silicon oxide film located in the photoelectric conversion region.

<Process L>

Figure 5L:
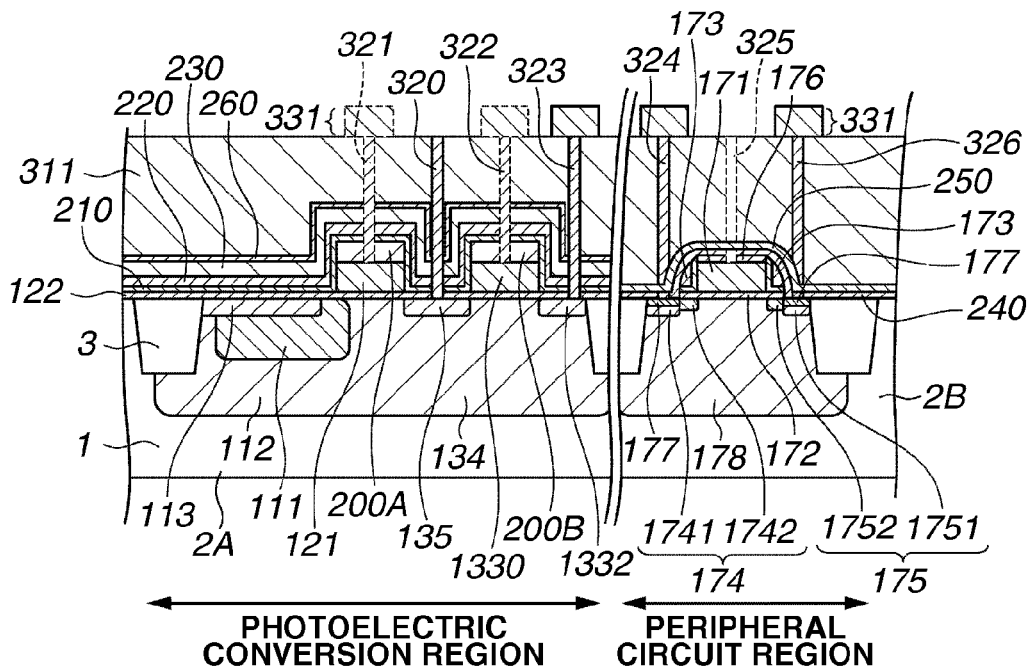

Process L according to the present exemplary embodiment will be described below with reference to FIG. 5L. In process L, a third intermediate film 260 covering the photoelectric conversion region and contacting the second protective film 230 is formed. The third intermediate film 260 can be formed at the same time as the second intermediate film 240 by not removing the portion of the silicon nitride film located in the photoelectric conversion region as described in process K. Further, formation of the third intermediate film 260 can be omitted as illustrated in FIGS. 3A and 3B.

The first interlayer insulating layer 311 is then formed by forming the insulation film covering the photoelectric conversion region and the peripheral circuit region and planarizing the insulation film. The insulation film can be planarized using methods such as a reflow method, an etch-back method, and a chemical mechanical polishing (CMP) method. Silicon oxide, and silicate glass such as BSG, PSG, and BPSG may be used as the material of the insulation film.

A contact is then formed. In the first step, a first contact hole which reaches the transfer gate electrode 121 is formed in the first interlayer insulating layer 311. A conductive material such as tungsten is then implanted in the first contact hole, and excessive tungsten is removed using the CMP method. The first contact plug 321 which contacts the transfer gate electrode 121 is thus formed.

At the same time, the second contact plug 322, the third contact plug 323, the seventh contact plug 327, and the shared contact plug 320 are formed. The shared contact plug 320 is formed to contact both the fifth semiconductor region 135 and the amplifying gate electrode 1320.

The first contact plug 321, the second contact plug 322, and the seventh contact plug 327 are arranged to respectively penetrate through the first members 200A, 200B, and 200C. However, the first members 200A, 200B, and 200C can be removed in the processes F, G, and H.

In the second step, a fifth contact hole which reaches the silicide layer 176 above the second gate electrode 171 is formed in the first interlayer insulating layer 311. A conductive material such as tungsten is then implanted in the fifth contact hole, and excessive tungsten is removed using the CMP method. The fifth contact plug 325 which contacts the second gate electrode 171 via the silicide layer 176 is thus formed.

The fifth contact plug 325 may contact the second gate electrode 171 by penetrating through the silicide layer 177. However, the fifth contact plug 325 may also contact the top surface of the silicide layer 177. At the same time, the fourth contact plug 324, the sixth contact plug 326, the eighth contact plug 328, and the ninth contact plug 329 are formed, contacting the top surface of the silicide layer 177 respectively.

The third protective film 250 functions as the etching stopper when forming each contact hole for forming the fourth contact plug 324, the sixth contact plug 326, the eighth contact plug 328, and the ninth contact plug 329. In other words, a self-align contact can be realized by the third protective film 250. The above-describe first step and second step may be performed in reverse order.

The contact plugs arranged in the photoelectric conversion region and the contact plugs arranged in the peripheral circuit region can be formed at the same time. However, according to one aspect the contact plugs are formed the photoelectric conversion region and the peripheral circuit region at different timings from one another.

More specifically, metal components (e.g., cobalt) included in the silicide layers 176 and 177 may be scattered when forming the contact hole in the peripheral circuit region. If the contact plugs are formed at different timings, it becomes less likely for such metal components to cause metal contamination in the photoelectric conversion region.

After forming the contact plugs, the wiring layer is formed. According to the present exemplary embodiment, aluminum is mainly used as the material of the wiring layer. After an aluminum film is formed above the first interlayer insulating layer, patterning may be appropriately performed on the aluminum film, and the first wiring layer can be formed.

After performing process L, a conventional multilayer wiring technique is used to form each of the wiring layers 331, 332, 333, and 334, and each of the interlayer insulating layers 312, 313, 314, and 315. The wiring structure 300 is thus formed. The passivation layer 440, the first planarization film 460, the color filter 470, the second planarization film 480, and the micro lens 490 are formed above the wiring structure 300. The photoelectric conversion device 100 according to the first exemplary embodiment as illustrated in FIG. 4A is thus acquired.

An example of the method for manufacturing the photoelectric conversion device 100 according to the second exemplary embodiment as illustrated in FIG. 4B will be described below. According to the present exemplary embodiment, processes from process A to process K according to the first exemplary embodiment are similarly performed, so that description will be omitted. Processes M, N, and O performed after process K will be described below.

<Process M>

Figure 5M:
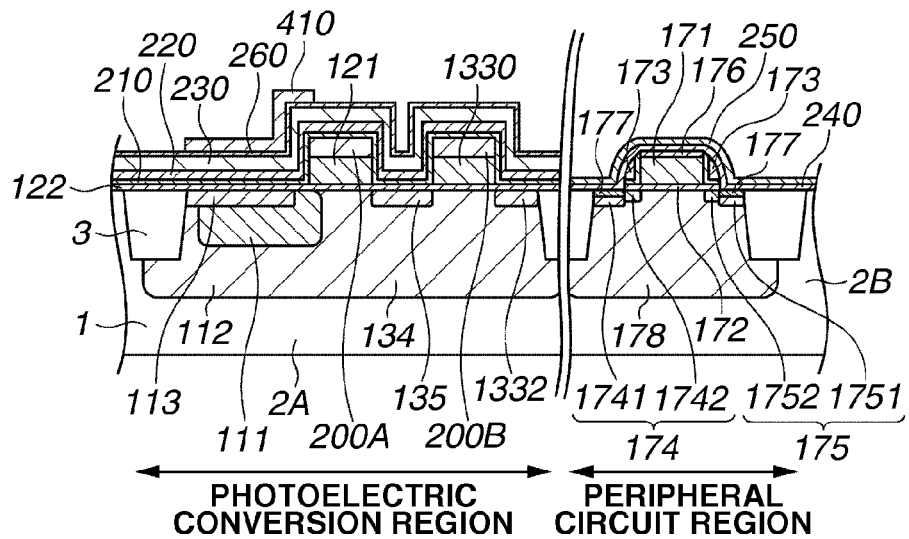
FIGS. 5M, 5N, and 5O are cross-sectional views illustrating steps M, N, and O respectively in an example of a manufacturing method of the photoelectric conversion device according to the second exemplary embodiment.

Process M according to the present exemplary embodiment will be described below with reference to FIG. 5M. In process L, the portion of the silicon oxide film located in the photoelectric conversion region is removed. According to the present exemplary embodiment, the silicon oxide film located in the photoelectric conversion region is left in the region in process M. The second intermediate film 240 in the peripheral circuit region and the third intermediate film 260 in the photoelectric conversion region are thus formed at the same time.

Further, in process L, the portion of the silicon nitride film located in the photoelectric conversion region is completely removed. According to the present exemplary embodiment, the portion of the silicon nitride film located on the photoelectric conversion element 110 is not removed and becomes a control film 410 in process M. Furthermore, the portion of the silicon nitride film left in the peripheral circuit region becomes the third protective film 250.

<Process N>

Figure 5N:
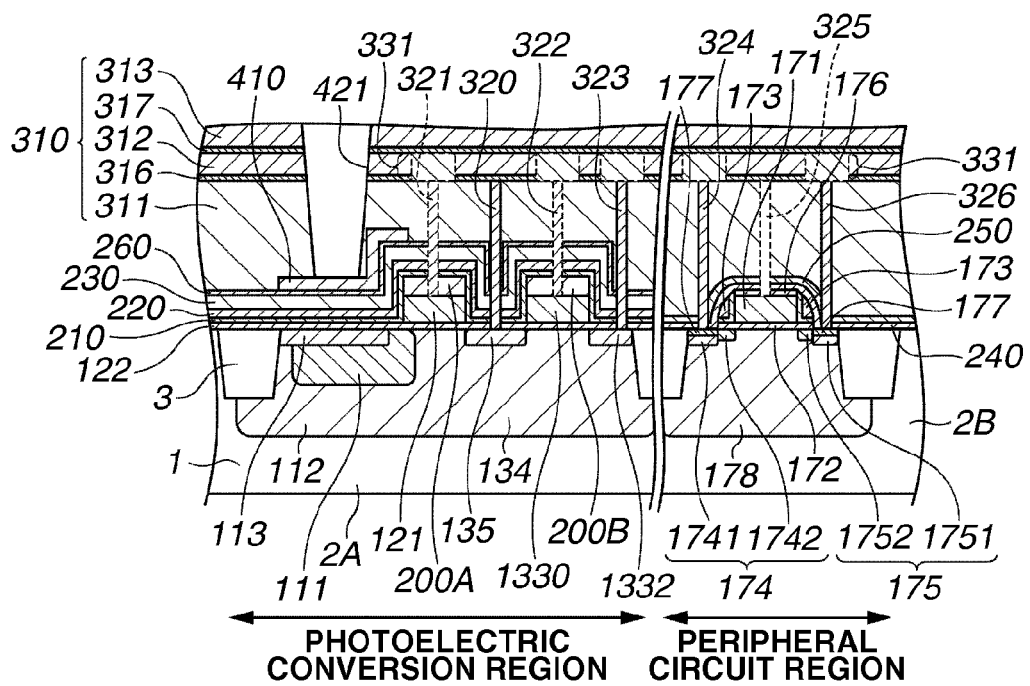

Process N according to the present exemplary embodiment will be described below with reference to FIG. 5N. In process N, the contact plugs are formed similarly as in process L. After forming the contact plugs, the first wiring layer 331 is formed. According to the present exemplary embodiment, the first wiring layer 331 is mainly formed of copper.

The second interlayer insulating layer 312 is then formed on the first interlayer insulating layer 311 via the first interlayer isolation layer 316 formed of silicon nitride. The first wiring layer 331 formed of copper is implanted in the second interlayer insulating layer 312 using a damascene method.

The second wiring layer 332, each of the interlayer insulating layers 313, 314, and 315, and each of the interlayer isolation layers 317, 318, and 319 are similarly formed using the conventional multilayer wiring technique. The wiring structure 300 is thus formed. A portion of the insulation film 310 in the wiring structure 300 is etched, and an opening 421 of a depth reaching the control film 410 is thus formed. The control film 410 can be used as the etching stopper when forming the opening 421.

<Process O>

Figure 5O:
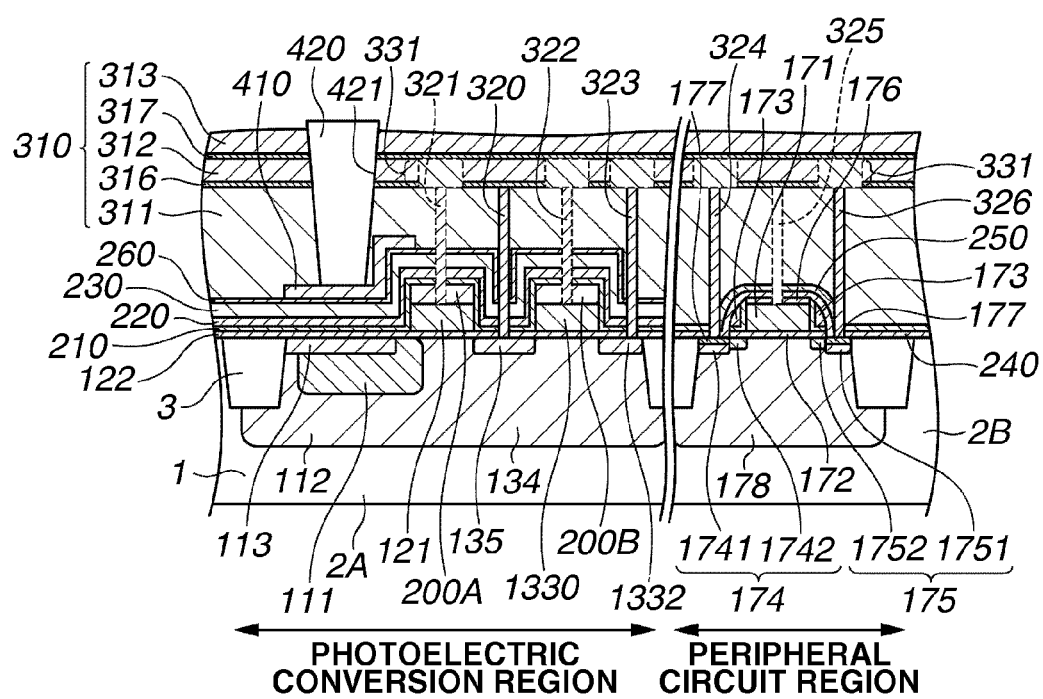

Process O according to the present exemplary embodiment will be described below with reference to FIG. 5O. A high-refractive index film formed of silicon nitride, having a higher refractive index as compared to the insulation film 310 is implanted in the opening 421. The light guide member 420 is thus formed. According to the present exemplary embodiment, the refractive index of the light guide member 420 is higher than the refractive indices of the first interlayer insulating layer 311, the second interlayer insulating layer 312, and the third interlayer insulating layer 313 in the insulation film 310.

According to one aspect the light guide member 420 is extended from inside the opening 421 to the top surface of the insulation film 310. The top surface of the light guide member 420 is then planarized using the CMP method. The control film 410 reduces the damage on the photoelectrical conversion element 110 when implanting the light guide member 420.

The light condensing film 430, the inner-layer lens 450, the first planarization film 460, the color filter 470, the second planarization film 480, and the micro lens 490 are then formed above the light guide member 420. The photoelectric conversion device 100 according to the second exemplary embodiment as illustrated in FIG. 4B is thus acquired.

As described above, according to the present exemplary embodiment, the method for manufacturing the semiconductor device can appropriately control the impurity concentration in the gate electrode of the first transistor and the impurity concentration in the gate electrode of the second transistor.

According to the above-described exemplary embodiments of the present invention, the photoelectric conversion device including the photoelectric conversion member is described as an example of the semiconductor device. However, aspects of the present invention may be applied to a method for manufacturing the semiconductor device which do not include the photoelectric conversion member. For example, aspects of the present invention may be applied to a semiconductor device which includes both an analog circuit and a digital circuit, or a semiconductor device which includes both a high-voltage circuit and a low-voltage circuit.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

What is claimed is:

1. A photoelectric conversion device comprising:
   a photoelectric conversion unit for outputting a electric signal base on a signal charge generated in a photoelectric conversion element, the photoelectric conversion unit including a first transistor; and a signal processing unit for processing the electric signal, the signal processing unit including a second transistor and a third transistor, wherein a gate insulation film of the second transistor is thinner than a gate insulation film of the first transistor, wherein the first transistor and the second transistor are first conductive type transistors, and the third transistor is a second conductive type transistor, wherein the signal processing unit has an electrode integrally including a first conductive type portion as a gate electrode of the second transistor and a second conductive type portion as a gate electrode of the third transistor, and an impurity concentration in the first conductive type portion is higher than an impurity concentration in a gate electrode of the first transistor.

2. The photoelectric conversion device according to claim 1, wherein the photoelectric conversion unit includes the photoelectric conversion element, a signal generation unit, and a transfer gate for transfer the signal charge from the photoelectric conversion element to the signal generation unit.

3. The photoelectric conversion device according to claim 2, wherein the first transistor has the transfer gate.

4. The photoelectric conversion device according to claim 2, wherein the signal generation unit has a capacitor, and the first transistor is an amplifying transistor having a gate connected to the capacitor.

5. The photoelectric conversion device according to claim 2, wherein the signal generation unit has a capacitor and the first transistor is a reset transistor having a source connected to the capacitor.

6. The photoelectric conversion device according to claim 1, wherein a drain of the second transistor is covered with a silicide layer which contains cobalt or nickel.

7. The photoelectric conversion device according to claim 6, wherein a silicide layer which contains cobalt or nickel is not formed above the gate electrode of the first transistor.

8. The photoelectric conversion device according to claim 1,
wherein the first conductive type portion and the second conductive type portion form the p-n junction, and
wherein the first conductive type portion and the second conductive type portion are covered by a silicide layer.

9. The photoelectric conversion device according to claim 1, wherein the first conductive type portion and the second conductive type portion form the p-n junction.

10. The photoelectric conversion device according to claim 1, wherein the first conductive type portion and the second conductive type portion are covered by a silicide layer.

11. The photoelectric conversion device according to claim 1, further comprising:
a film arranged to cover the gate electrode of the first transistor; and
a member arranged between the film and the gate electrode of the first transistor, the member being formed of insulating material,
wherein the member contacts with a top surface of the gate electrode of the first transistor,
wherein the member does not contact a side surface of the gate electrode of the first transistor, and
wherein the film covers the side surface of the gate electrode of the first transistor.

12. The photoelectric conversion device according to claim 1, wherein the impurity concentration of the first conductive type portion is greater than or equal to 3/2 times the impurity concentration in the gate electrode of the first transistor.

13. The photoelectric conversion device according to claim 1, wherein a sheet resistance of the first conductive type portion is smaller than or equal to ⅔ of a sheet resistance of the gate electrode of the first transistor.

14. The photoelectric conversion device according to claim 1, wherein the impurity concentration in the gate electrode of the first transistor and the impurity concentration of the first conductive type portion are from $1 \times 10^{21}$ atoms/cm$^3$ to $1 \times 10^{22}$ atoms/cm$^3$.

15. The photoelectric conversion device according to claim 1, wherein a drain of the second transistor has a lightly doped drain (LDD) structure.

16. The photoelectric conversion device according to claim 1, wherein the photoelectric conversion element and the first transistor are arranged on a same active region which is surrounded by an isolation region having a shallow trench isolation (STI) structure or a local oxidation silicon (LOCOS) structure.

17. The photoelectric conversion device according to claim 1, further comprising an isolation region having a shallow trench isolation (STI) structure,
wherein the isolation region is disposed between the photoelectric conversion element and a transistor of the photoelectric conversion unit.

18. The photoelectric conversion device according to claim 1, further comprising an optical waveguide structure formed above the photoelectric conversion element.

19. An imaging system comprising:
a photoelectric conversion unit for outputting a electric signal base on a signal charge generated in a photoelectric conversion element, the photoelectric conversion unit including a first transistor; and
a signal processing unit for processing the electric signal, the signal processing unit including a second transistor and a third transistor
an image processing engine which processes an image based on the electric signal; and
an image display unit which displays the image,
wherein a gate insulation film of the second transistor is thinner than a gate insulation film of the first transistor,
wherein the first transistor and the second transistor are first conductive type transistors, and the third transistor is a second conductive type transistor,
wherein the signal processing unit has an electrode integrally including a first conductive type portion as a gate electrode of the second transistor and a second conductive type portion as a gate electrode of the third transistor, and
wherein an impurity concentration in the first conductive type portion is higher than an impurity concentration in a gate electrode of the first transistor.

20. The imaging system device according to claim 19,
wherein the first conductive type portion and the second conductive type portion form the p-n junction, and
the first conductive type portion and the second conductive type portion are covered by a silicide layer.

* * * * *